(12) United States Patent
Takayama et al.

(10) Patent No.: US 11,817,678 B2
(45) Date of Patent: Nov. 14, 2023

(54) SEMICONDUCTOR LASER AND LASER RADAR DEVICE HAVING THE SEMICONDUCTOR LASER

(71) Applicant: SAE Magnetics (H.K.) Ltd., Hong Kong (HK)

(72) Inventors: Seiichi Takayama, Hong Kong (HK); Kang Gao, Hong Kong (HK); Ryo Hosoi, Hong Kong (HK); Ryuji Fujii, Hong Kong (HK)

(73) Assignee: SAE Magnetics (H.K.) Ltd., Hong Kong (HK)

(*) Notice: Subject to any disclaimer, the term of this patent is extended or adjusted under 35 U.S.C. 154(b) by 491 days.

(21) Appl. No.: 17/211,818

(22) Filed: Mar. 25, 2021

(65) Prior Publication Data

US 2022/0311217 A1    Sep. 29, 2022

(51) Int. Cl.
*H01S 5/34* (2006.01)
*G01S 17/931* (2020.01)
*H01L 33/06* (2010.01)
*H01S 5/042* (2006.01)

(52) U.S. Cl.
CPC .......... *H01S 5/3412* (2013.01); *G01S 17/931* (2020.01); *H01L 33/06* (2013.01); *H01S 5/04254* (2019.08)

(58) Field of Classification Search
CPC .................. H01S 5/3412; H01S 5/164
See application file for complete search history.

(56) References Cited

U.S. PATENT DOCUMENTS

| 2014/0064310 A1* | 3/2014 | Chua | ......................... H01S 5/11 |
| | | | 372/45.01 |
| 2015/0138562 A1* | 5/2015 | Uchida | .................. B82Y 20/00 |
| | | | 372/45.01 |

FOREIGN PATENT DOCUMENTS

| JP | 05173634 A | 7/1993 |
| JP | 10026667 A | 1/1998 |
| JP | 2011025884 A | 2/2011 |
| JP | 2017003391 A | 1/2017 |
| JP | 2017150902 A | 8/2017 |
| JP | 2018189521 A | 11/2018 |

* cited by examiner

*Primary Examiner* — Tuan N Nguyen

(57) ABSTRACT

A semiconductor laser includes an active layer which emits laser light and cladding layers being formed so as to sandwich the active layer. The active layer includes a quantum dot layer including a plurality of quantum dots, which respectively confine movements of carriers in the three-dimensional directions. The laser radar device includes a light projection part which projects laser light and a light receiving part which receives reflected light of the laser light. The light projection part includes the semiconductor laser and a scanner which reflects the laser light, emitted from the semiconductor laser, to form a scanning laser light.

16 Claims, 30 Drawing Sheets

SEMICONDUCTOR LASER AND LASER RADAR DEVICE HAVING THE SEMICONDUCTOR LASER

BACKGROUND

Field of the Invention

The present invention relates to a semiconductor laser and laser radar device having the semiconductor laser.

Related Background Art

The semiconductor lasers (referred to also as laser diodes) have been conventionally used in the various fields. For example, the semiconductor lasers have been used in the field of a laser radar. The laser radar is the technology also called LiDAR (Light Detection and Ranging).

The laser radar is the technology that distances to objects, positions and forms of the objects are measured, utilizing laser light emitted from the semiconductor laser.

The laser radar is the technology which is indispensable to vehicle control such as automatic driving, driving speed control or the like. Therefore, devices utilizing the laser radar (laser radar devices) are mounted on the vehicles, and the laser radar devices are utilized for vehicle control such as automatic driving, driving speed control or the like.

A conventional technology concerning the laser radar devices is disclosed in, for example, JPH 5-173634 (also called patent document 1), JPH 10-26667 (also called patent document 2), JP2011-25884 (also called patent document 3), JP2017-3391 (also called patent document 4), JP2017-150902 (also called patent document 5), JP2018-189521 (also called patent document 6).

SUMMARY OF THE INVENTION

By the way, in the conventional semiconductor lasers which are used in the laser radar devices, an action, which is called "mode hopping", sometimes occurs. The mode hopping means an unstable action which the oscillation wavelength of the semiconductor laser changes suddenly.

Because the oscillation wavelength of the semiconductor laser changes suddenly, when the mode hopping occurs, fluctuation about light emission intensity, wavelength, phase, occurs in the semiconductor laser as a noise. Then, it makes optical output of the semiconductor laser unstable.

Therefore, when vehicle control, such as automatic driving, driving speed control or the like, is performed by the laser radar device, control operation of the laser radar device becomes unstable, there is a possibility which the quality of vehicle control by the laser radar device, such as automatic driving, driving speed control or the like, is lowered.

Then, it is known that the mode hopping occurs with a change of temperature, a change of optical output.

Besides, it is also known that the semiconductor laser is susceptible to temperature, namely various characteristics of the semiconductor laser, such as oscillation wavelength, optical output, ILV-curve or the like, change with temperature. For example, in the semiconductor laser, as illustrated by I1, I2, I3, in FIG. 30, intensity of optical output largely changes by temperature.

Then, when vehicle control such as automatic driving, driving speed control or the like is performed by the laser radar device, the conventional laser radar devices are mounted in the front of the vehicles, so that the laser light is irradiated in front more than the vehicles. Power sources (gasoline engines, motors) are usually mounted near the laser radar devices.

Therefore, when the power sources are working (especially, the vehicles are running), heat by the operation of the power sources is conveyed to the laser radar devices, thereby temperature of the laser radar devices rises. Further, temperature also rises with the generation of heat in accordance with light emission of the semiconductor lasers.

Whichever the cases occur, because the mode hopping of the semiconductor laser is induced, the quality of vehicle control, performed by the laser radar device, is lowered.

Namely, when the laser radar devices are utilized for vehicle control such as automatic driving, driving speed control or the like, the semiconductor laser, which is sensitive to temperature, is placed in an environment which the change of temperature occurs easily, and it is extremely difficult to avoid the environment temperature variation. Therefore, in case of the conventional laser radar devices, there is a possibility of an inducement of the mode hopping in the semiconductor laser, thereby the quality of vehicle control is lowered.

In order to prevent the lowering of the quality of vehicle control in the laser radar devices, it is preferable that the semiconductor laser is not susceptible to temperature, namely, the semiconductor laser is insensible to temperature.

However, in the conventional semiconductor laser is susceptible to temperature, therefore, it is difficult to prevent the mode hopping from occurring. Therefore, in the laser radar devices having the conventional semiconductor laser, because there is a possibility of lowering of the quality of vehicle control, new semiconductor laser and the laser radar device, having the new semiconductor laser, are needed.

Hence the present invention is made to solve the above problem, and it is an object to stabilize the quality of vehicle control performed by the laser radar device by devising the semiconductor laser so as to be insensible to temperature, in the semiconductor laser and the laser radar device having the semiconductor laser.

To solve the above problem, the present invention is a semiconductor laser including: an active layer which emits laser light; and cladding layers being formed so as to sandwich the active layer, the active layer includes a quantum dot layer including a plurality of quantum dots, which respectively confine movements of carriers in the three-dimensional directions.

In case of the above-described semiconductor laser, it is possible that the active layer includes at least two quantum dot layers, the active layer includes a multi-layered structure which the at least two quantum dot layers are stacked.

Further, in case of the above-described semiconductor laser, it is possible that the quantum dot layer includes a low-density area of which arrangement density of the quantum dots is lower than the other areas.

Further, in case of the above-described semiconductor laser, it is also possible that the semiconductor laser further including: a stripe electrode being formed in a straight band-like shape, the quantum dot layer includes a low-density area of which arrangement density of the quantum dots is lower than the other areas, the low-density area is arranged in a stripe-area, corresponding to the stripe electrode.

Further, it is also possible that the low-density area is arranged in a window-area, of the stripe-area, corresponding to a laser light emitting part which laser light is emitted.

Further, it is also possible that the semiconductor laser further including: a stripe electrode being formed in a straight band-like shape, the multi-layered structure is a structure which window-formed quantum dot layers are stacked as the quantum dot layers, the window-formed quantum dot layer includes low-density areas of which arrangement density of the quantum dots are lower than the other areas, the low-density areas are arranged in window-areas, of stripe-areas corresponding to the stripe electrode, corresponding to a laser light emitting part which laser light is emitted.

Furthermore, it is also possible that the multi-layered structure is a structure which even dot layers and uneven dot layers are stacked alternately, the even dot layers include the quantum dots, being formed in almost the whole of the respective quantum dot layers, and the uneven dot layers include non-dot areas, in which the quantum dots are not formed.

Furthermore, it is possible that the non-dot areas are arranged in window-areas corresponding to laser light emitting part which laser light is emitted, in the respective uneven dot layers.

It is possible that the multi-layered structure is a structure which even dot layers and uneven dot layers are stacked so that the even dot layers sandwich the uneven dot layers, the even dot layers include the quantum dots, being formed in almost the whole of the respective quantum dot layers, and the uneven dot layers include non-dot areas, in which the quantum dots are not formed.

It is also possible that the non-dot areas are arranged in center-areas, including center parts of the uneven dot layers.

It is also possible that the quantum dot layer includes size different structure which sizes of the quantum dots, formed in the low-density areas, are larger than sizes of the quantum dots, formed in the areas other than the low-density areas.

It is also possible that the quantum dot layer includes composition-different structures which compositions of the quantum dots, formed in the low-density areas, are different from compositions of the quantum dots, formed in the areas other than the low-density areas.

It is also possible that the window-areas have lengths, of the direction along by an end surface of the active layer, being extended than the stripe-areas, in the respective quantum dot layers.

It is also possible that the window-areas have lengths, of the direction along by an end surface of the active layer, being extended than the stripe-areas, as they gradually approach the end surface of the active layer, in the respective quantum dot layers.

Further, the present invention provides a laser radar device including: a light projection part which projects laser light; and a light receiving part which receives reflected light of the laser light, the light projection part includes a semiconductor laser and a scanner which reflects the laser light, emitted from the semiconductor laser, to form a scanning laser light, the semiconductor laser includes an active layer which emits laser light and cladding layers being formed so as to sandwich the active layer, the active layer includes a quantum dot layer including a plurality of quantum dots, which respectively confine movements of carriers in the three-dimensional directions.

In case of the above-described laser radar device, it is possible that the active layer includes at least two quantum dot layers, the active layer includes a multi-layered structure which the at least two quantum dot layers are stacked.

Further, in case of the above-described laser radar device, it is possible that the quantum dot layer includes a low-density area of which arrangement density of the quantum dots is lower than the other areas.

Furthermore, in case of the above-described laser radar device, it is possible that the laser radar device, further including: a stripe electrode being formed in a straight band-like shape, the quantum dot layer includes a low-density area of which arrangement density of the quantum dots is lower than the other areas, the low-density area is arranged in a stripe-area, corresponding to the stripe electrode.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the Laser Radar Device)

Figure 1:
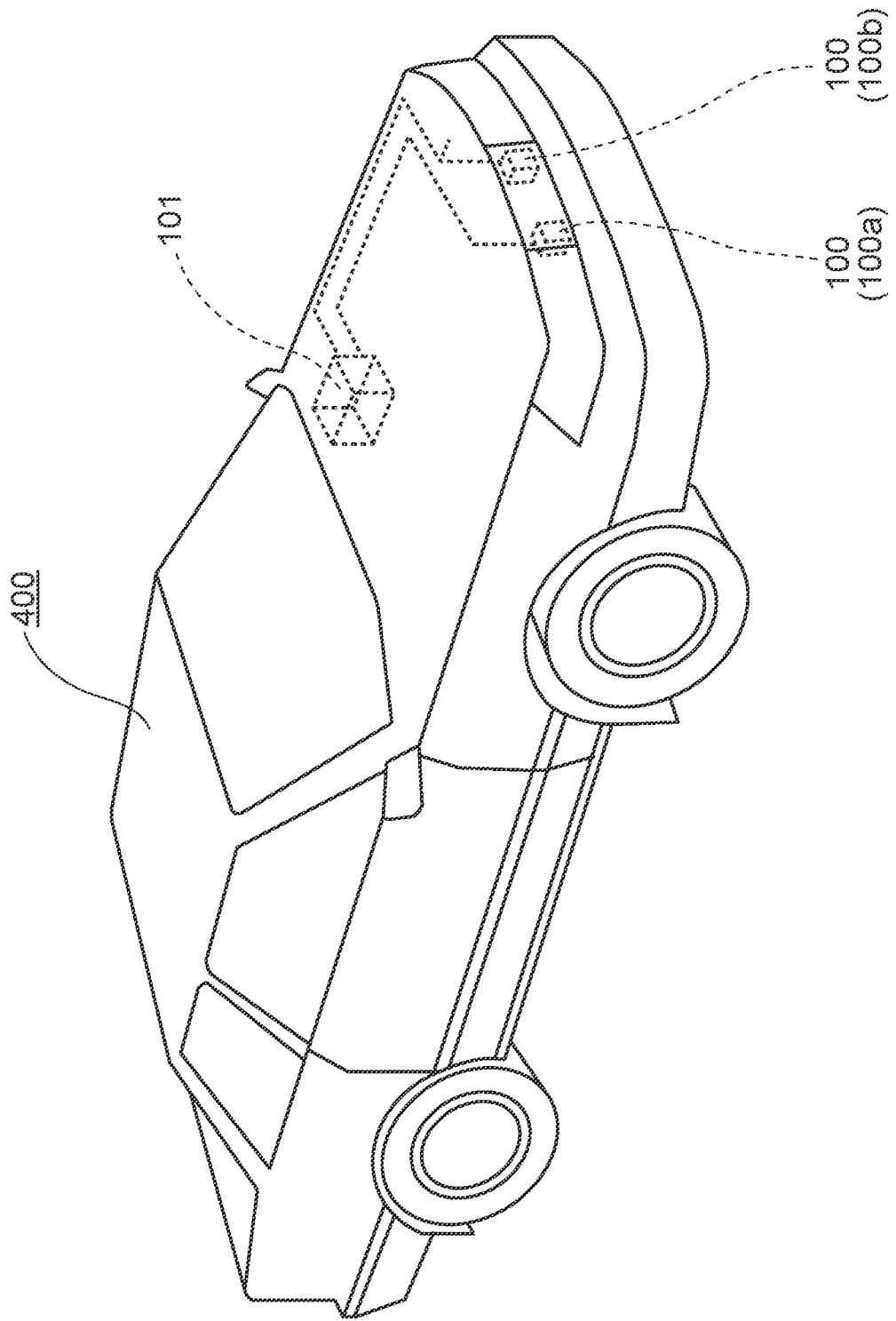
FIG. 1 is a perspective view showing the vehicle which the laser radar devices, according to an embodiment of the present invention, are mounted.
Figure 2:
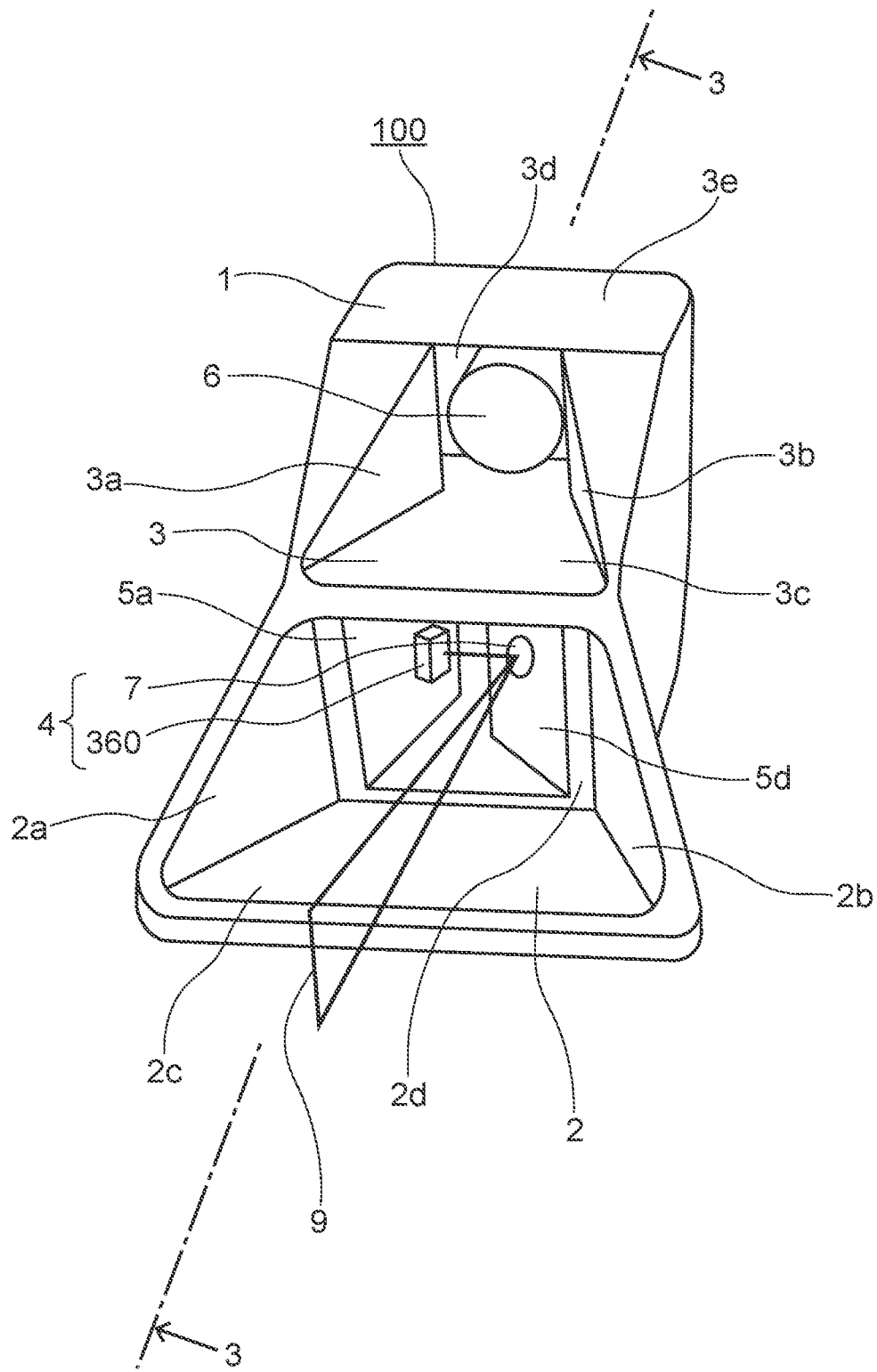
FIG. 2 is a perspective view of the laser radar device, seen from the approximate front side.
Figure 3:
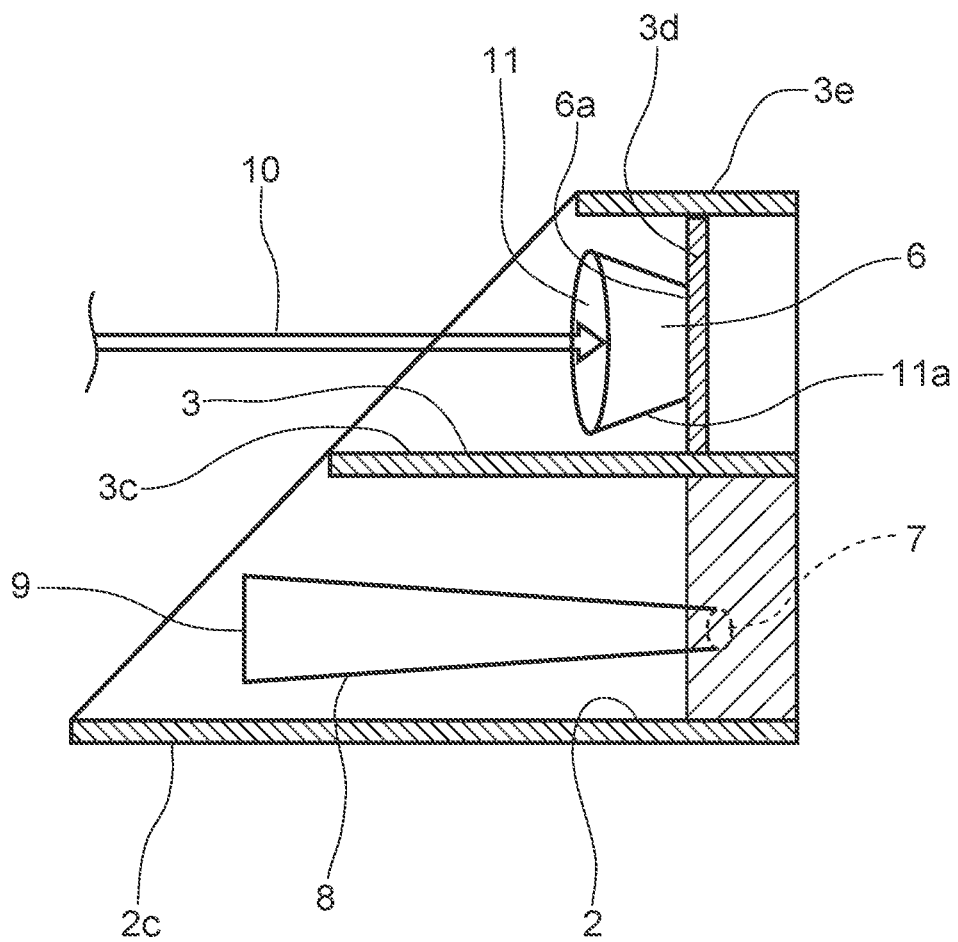
FIG. 3 is a sectional view taken along the line 3-3 in FIG. 2.
Figure 4:
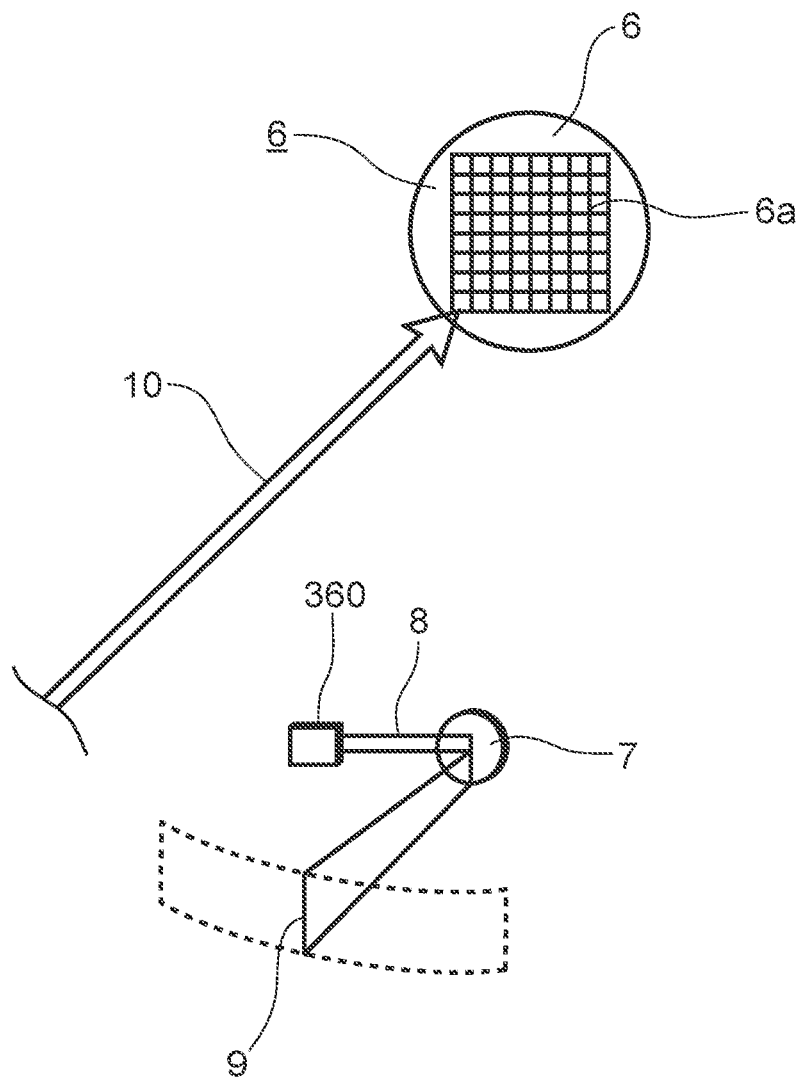
FIG. 4 is a view schematically showing operation of light projection and operation of light receiving performed by the laser radar device.
Figure 5:
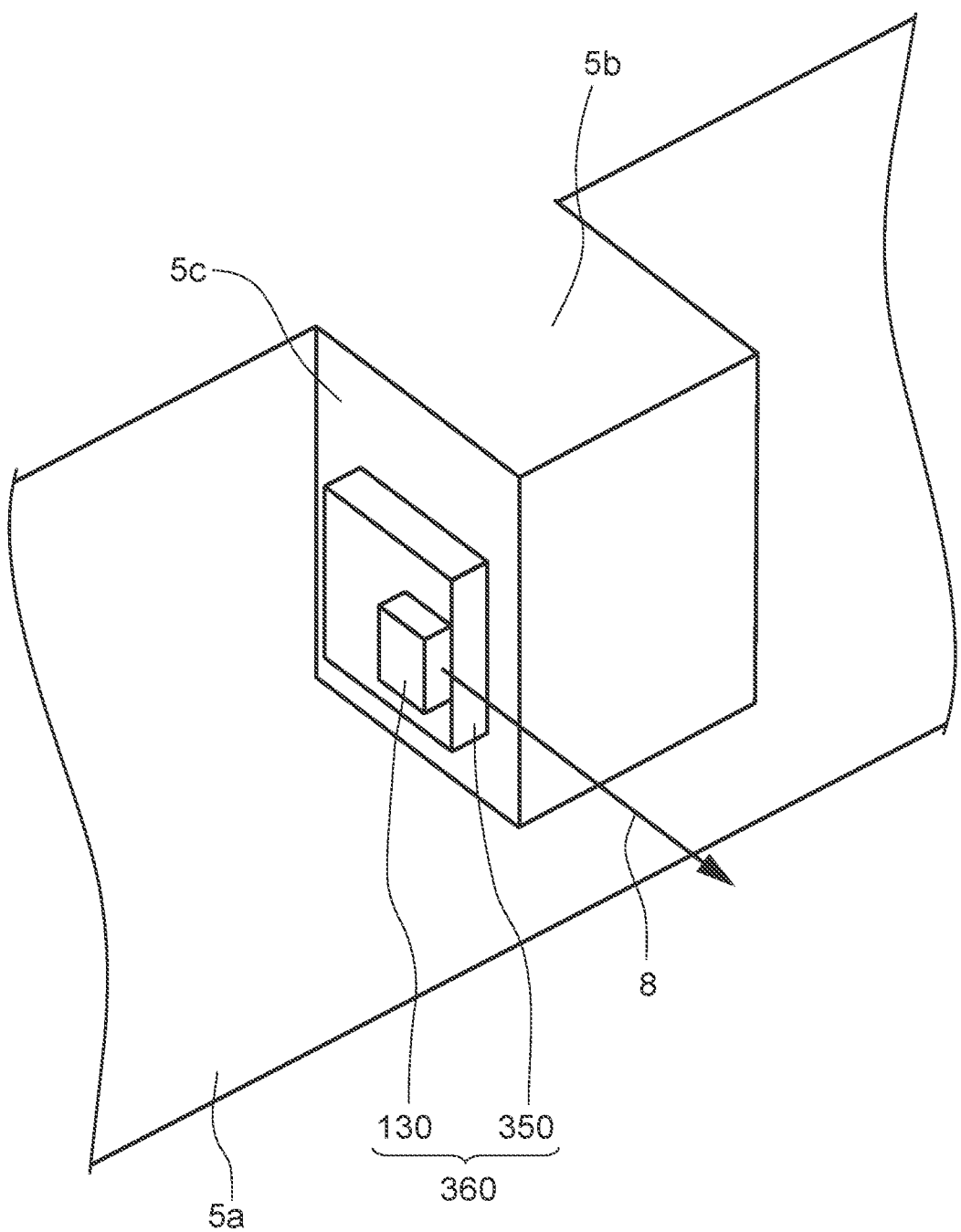
FIG. 5 is a perspective view of the principal part, in a light source-unit side, of a light projection part of the laser radar device.
Figure 6:
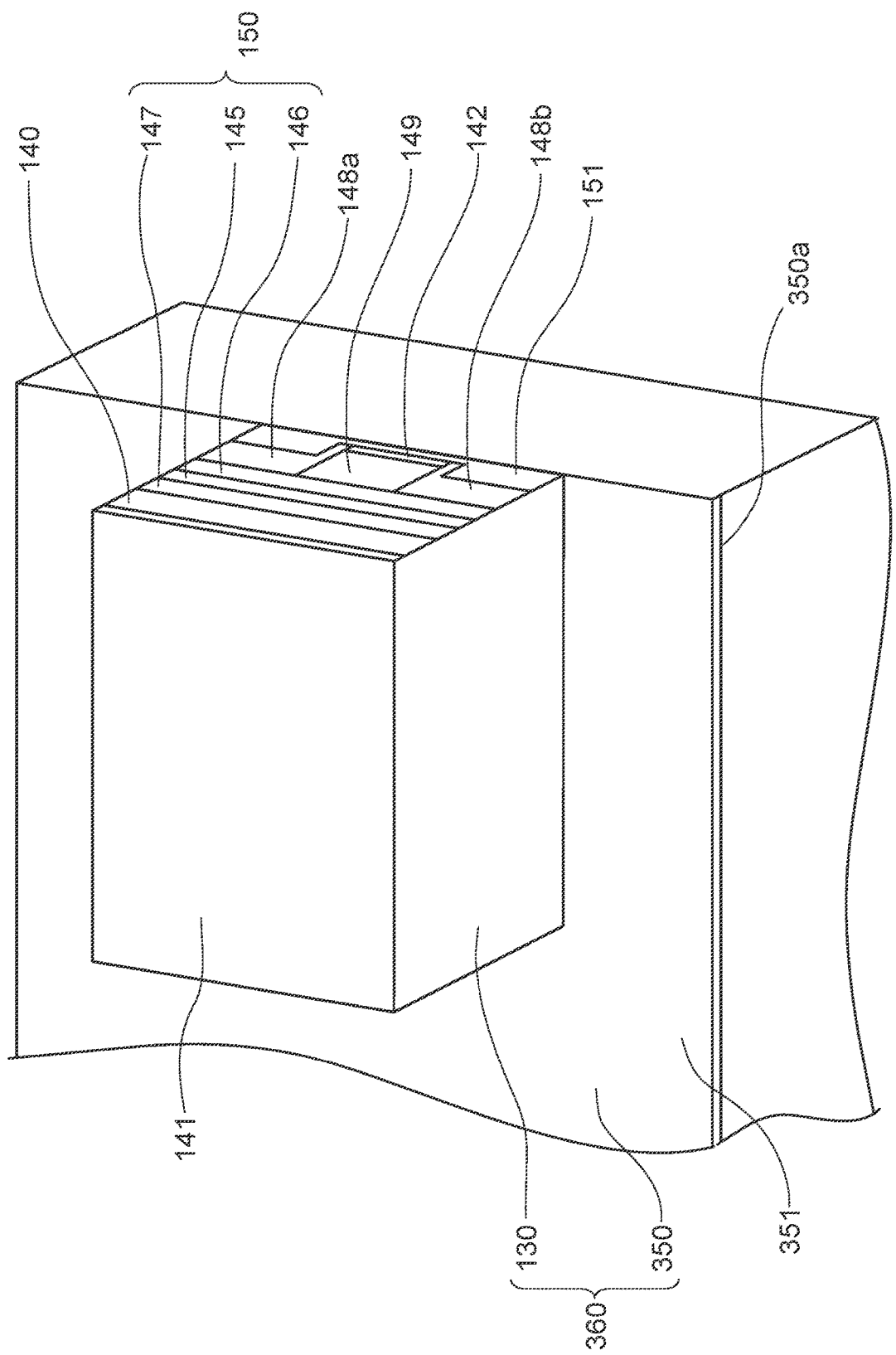
FIG. 6 is a perspective view, with enlargement, showing the principal part of the light source-unit included in the laser radar device.

To begin with, structure of the laser radar device according to the embodiment of the present invention will be explained with reference to FIG. 1 to FIG. 5. Here, FIG. 1 is a perspective view showing a vehicle 400 which the laser radar devices 100 (100a, 100b), according to an embodiment of the present invention, are mounted. FIG. 2 is a perspective view of the laser radar device 100, seen from the approximate front side. FIG. 3 is a sectional view taken along the line 3-3 in FIG. 2. FIG. 4 is a view schematically showing operation of light projection and operation of light receiving of the laser radar device 100. FIG. 5 is a perspective view of the principal part, in a light source-unit 360 side, of a light projection part 4 of the laser radar device 100. FIG. 6 is a perspective view, with enlargement, showing the principal part of the light source-unit 360 included in the laser radar device 100.

A control device, for realizing automatic driving (automatic driving control device), is mounted on the vehicle 400. The laser radar devices 100 are mounted on the vehicle 400 as a part of the automatic driving control device.

The laser radar devices 100 (100a, 100b) are mounted on the two front parts (neighborhood of headlights) of the vehicle 400. An electronic control unit 101 is mounted on the vehicle 400. The laser radar devices 100 (100a, 100b) are connected to the electronic control unit 101.

The electronic control unit 101 performs data processing based on detected data, input from the laser radar devices 100 (100a, 100b), a not-illustrated vehicle speed sensor, steering angle sensor and so on, to perform a control for realizing the automatic driving.

As illustrated in FIG. 2, FIG. 3, the laser radar devices 100 (100a, 100b) respectively have first accommodation spaces 2 and second accommodation spaces 3. The laser radar devices 100 respectively have structures which the second accommodation spaces 3 are piled up on the first accommodation spaces 2.

The first accommodation space 2 has side panels 2a, 2b, being arranged so that they are approximate opposite each other, a bottom panel 2c and a rear panel 2d. The light projection part 4 is arranged on the rear panel 2d.

The second accommodation space 3 has side panels 3a, 3b, being arranged so that they are approximate opposite each other, a bottom panel 3c, a rear panel 3d and an upper panel 3e. The light receiving part 6 is arranged on the rear panel 3d.

The light projection part 4 has a light source-unit 360 and a MEMS scanner 7. As illustrated in FIG. 5 in detail, the light source-unit 360 is formed on a light source panel 5a. A convex part 5b is formed on the source panel 5a. The light source-unit 360 is fixed on a side surface 5c of the convex part 5b.

The laser light 8 is emitted from the light source-unit 360 though, form and size of the convex part 5b, position of the light source-unit 360 and so on are decided so that the laser light 8 is inputted to the MEMS scanner 7.

The MEMS scanner 7 is formed on a scanner panel 5d. The MEMS scanner 7 has a MEMS mirror (not-illustrated).

The MEMS mirror is formed with MEMS (Micro Electro Mechanical Systems) technology. The MEMS mirror reflects the laser light 8, thereby the MEMS scanner 7 forms a scanning laser light 9 which scans objections, arranged in the surrounding of the vehicle 400. The scanning laser light 9 is projected toward the objections arranged in the surrounding of the vehicle 400.

In the MEMS scanner 7, not-illustrated magnets are arranged under the MEMS mirror, and not-illustrated coils are arranged in the surrounding of the MEMS mirror. Lorentz force is occurred when current flow the coils, the Lorentz force makes the MEMS mirror slanted.

Therefore, when the laser light 8, emitted from the light source-unit 360, is reflected by the MEMS mirror, as illustrated in FIG. 4, the scanning laser light 9, which scans the surrounding objections, is formed.

As illustrated in FIG. 2, FIG. 3, the light receiving part 6 is formed on the rear panel 3d of the second accommodation space 3. The light receiving part 6 has a light receiving element array 6a, being formed on the rear panel 3d and a light receiving lens 11. The light receiving element array 6a, as illustrated in FIG. 4 in detail, has a plurality of light receiving elements, arranged in a two-dimensional array form.

The light receiving lens 11 is arranged in front of the light receiving element array 6a with a fixing member 11a. Then, as illustrated in FIG. 4, in detail, a reflected light 10 is input to the light receiving part 6, thereby the light receiving element array 6a, of the light receiving part 6, receives the reflected light 10. The scanning laser light 9 is input to the surrounding objections, then the scanning laser light 9 is reflected from the objections, thereby the reflected light 10 is formed.

Then as illustrated in FIG. 5, FIG. 6, the light source-unit 360 includes the laser diode 130. The laser diode 130 corresponds to the semiconductor laser, according to the embodiment of this invention, as it is described later in detail, a later-described active layer 145, being included in the laser diode 130, includes quantum dot layers 161 to 165, which a plurality of quantum dots 166 are formed. Therefore, variations of characteristics, in accordance with the change of temperature, are hard to occur in the laser diode 130, the laser diode 130 is hard to be affected by temperature. Namely, the laser diode 130 is devised so as to be insensible to temperature. Therefore, the quality of vehicle control, by the laser radar devices 100, is stable, in the vehicle 400.

(Light Source-Unit, Laser Diode)

Figure 7:
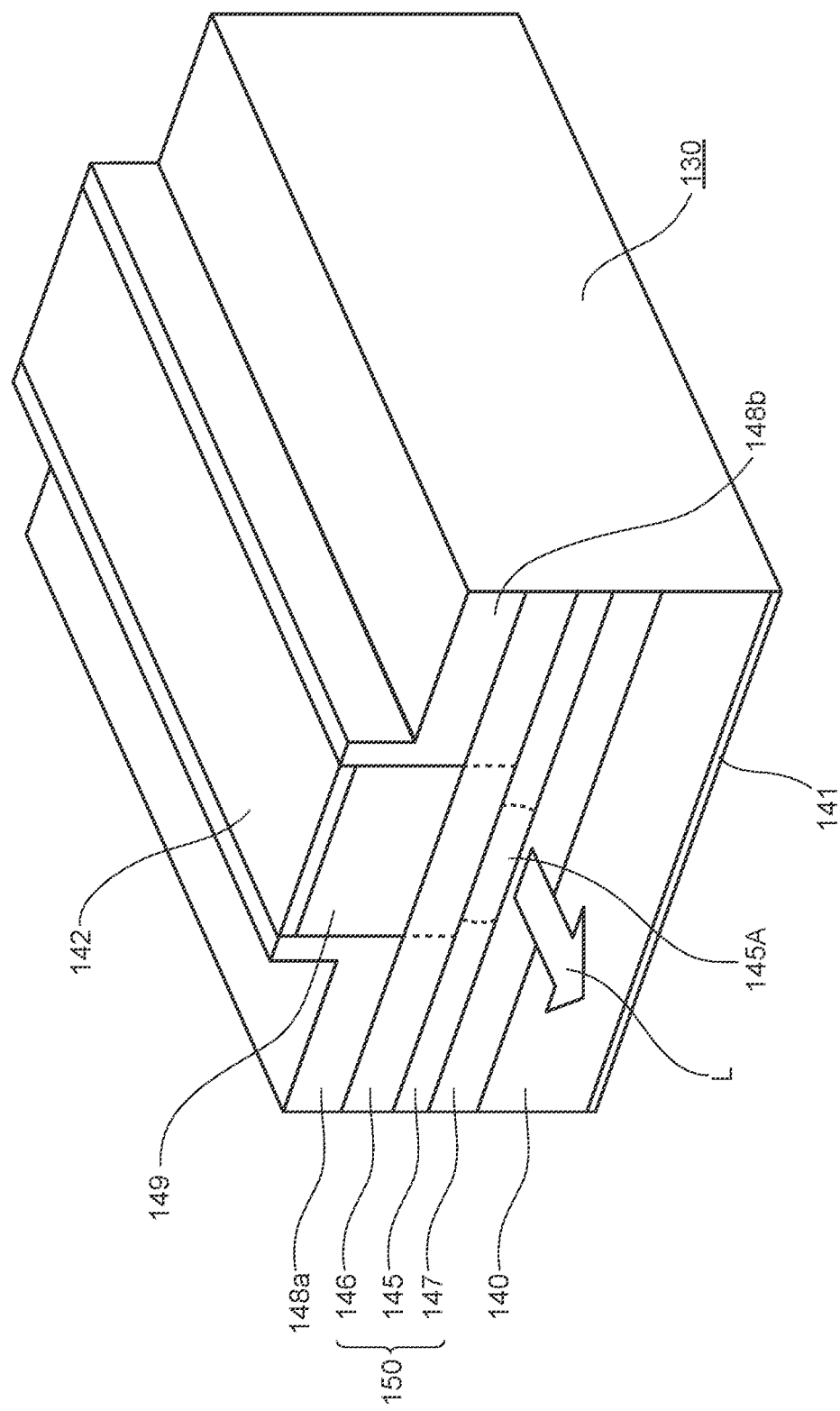
FIG. 7 is a perspective view showing the laser diode.
Figure 8:
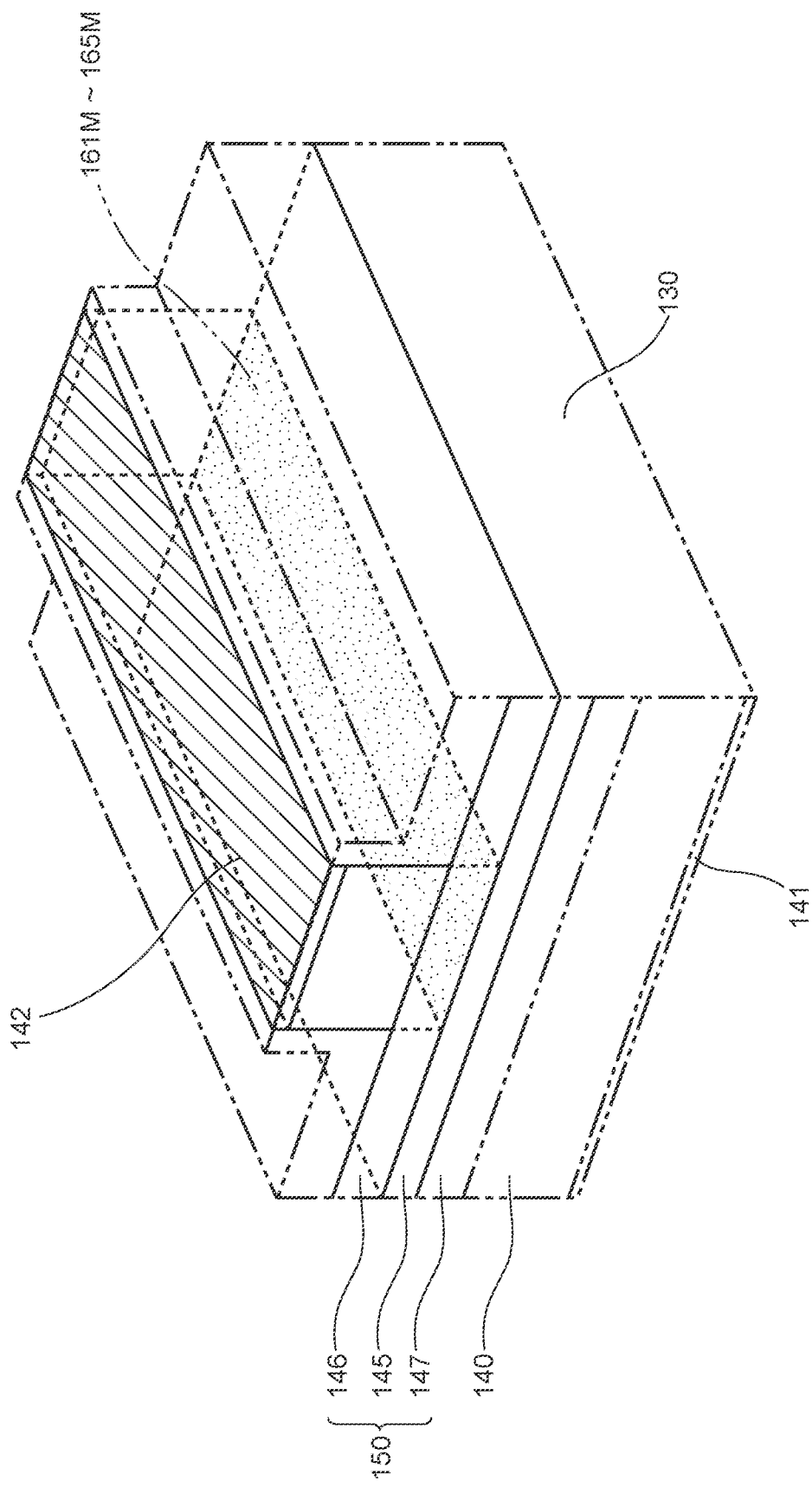
FIG. 8 is a perspective view showing the laser diode so as to clarify a stripe p-electrode and a stripe-area of an active layer.
Figure 9:
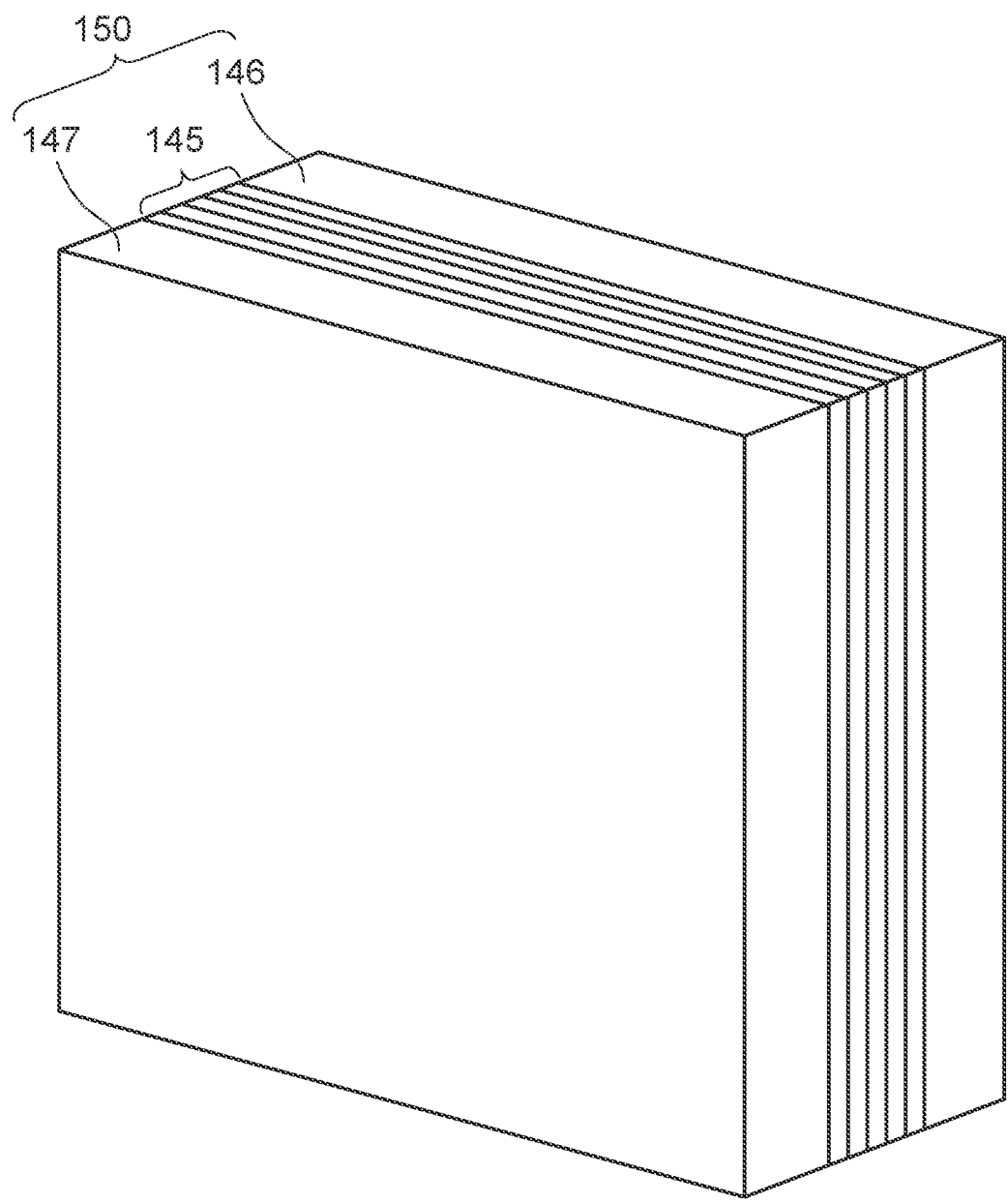
FIG. 9 is a perspective view showing an optical generating layer being included in the laser diode.
Figure 10:
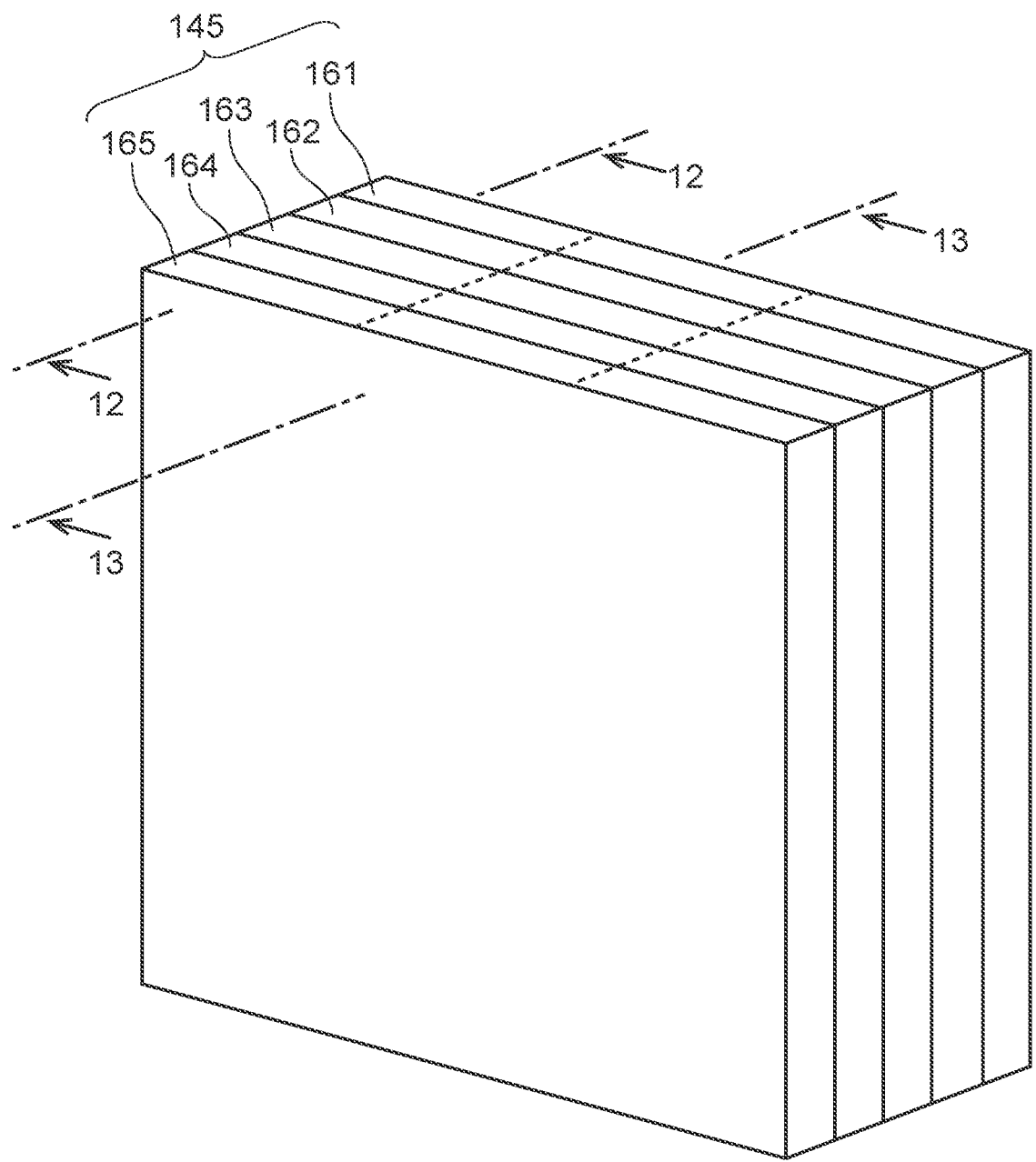
FIG. 10 is a perspective view showing the active layer which is included in the laser diode according to the embodiment of the present invention.
Figure 11:
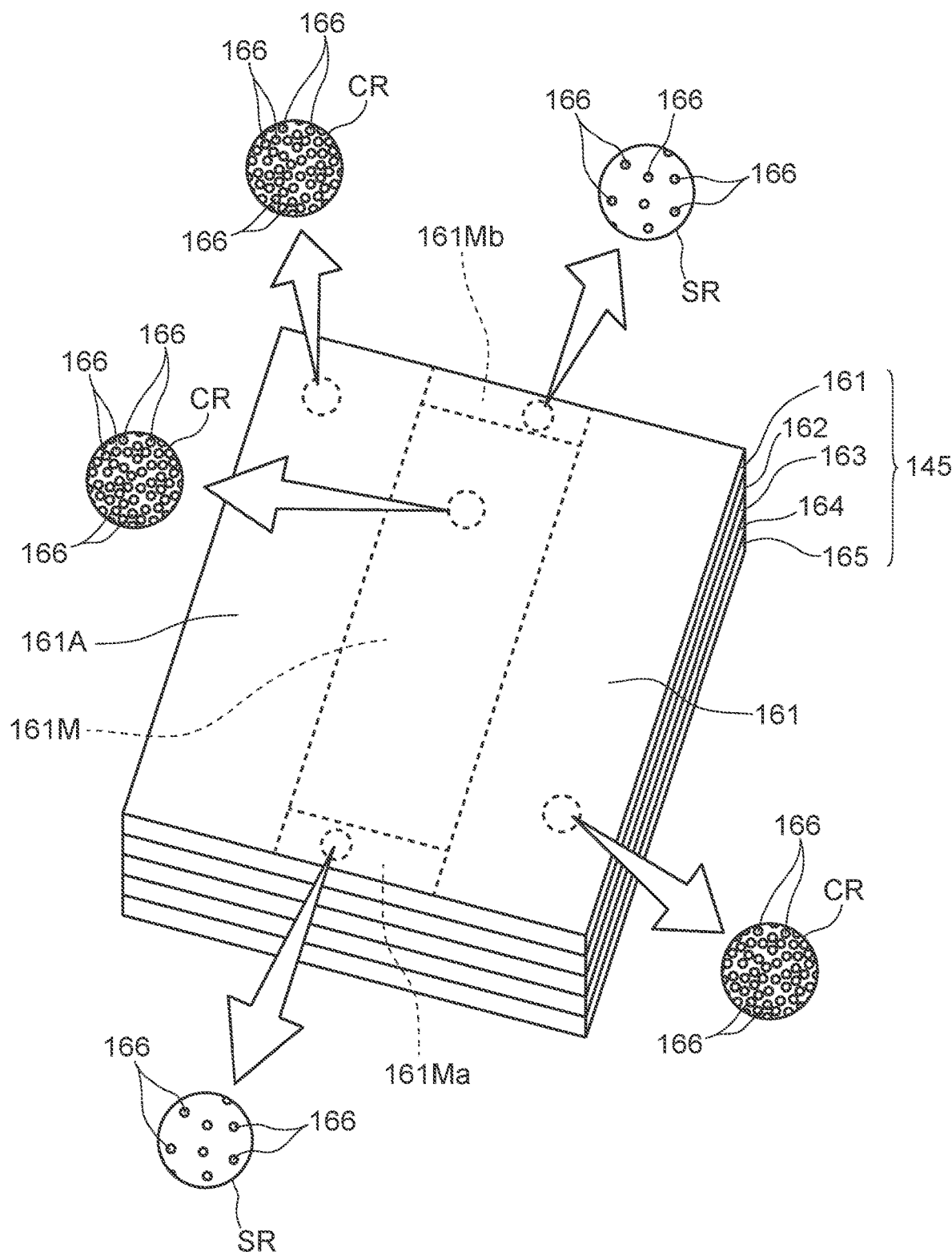
FIG. 11 is a perspective view showing the active layer, seen from a first layered quantum dot layer.
Figure 12:
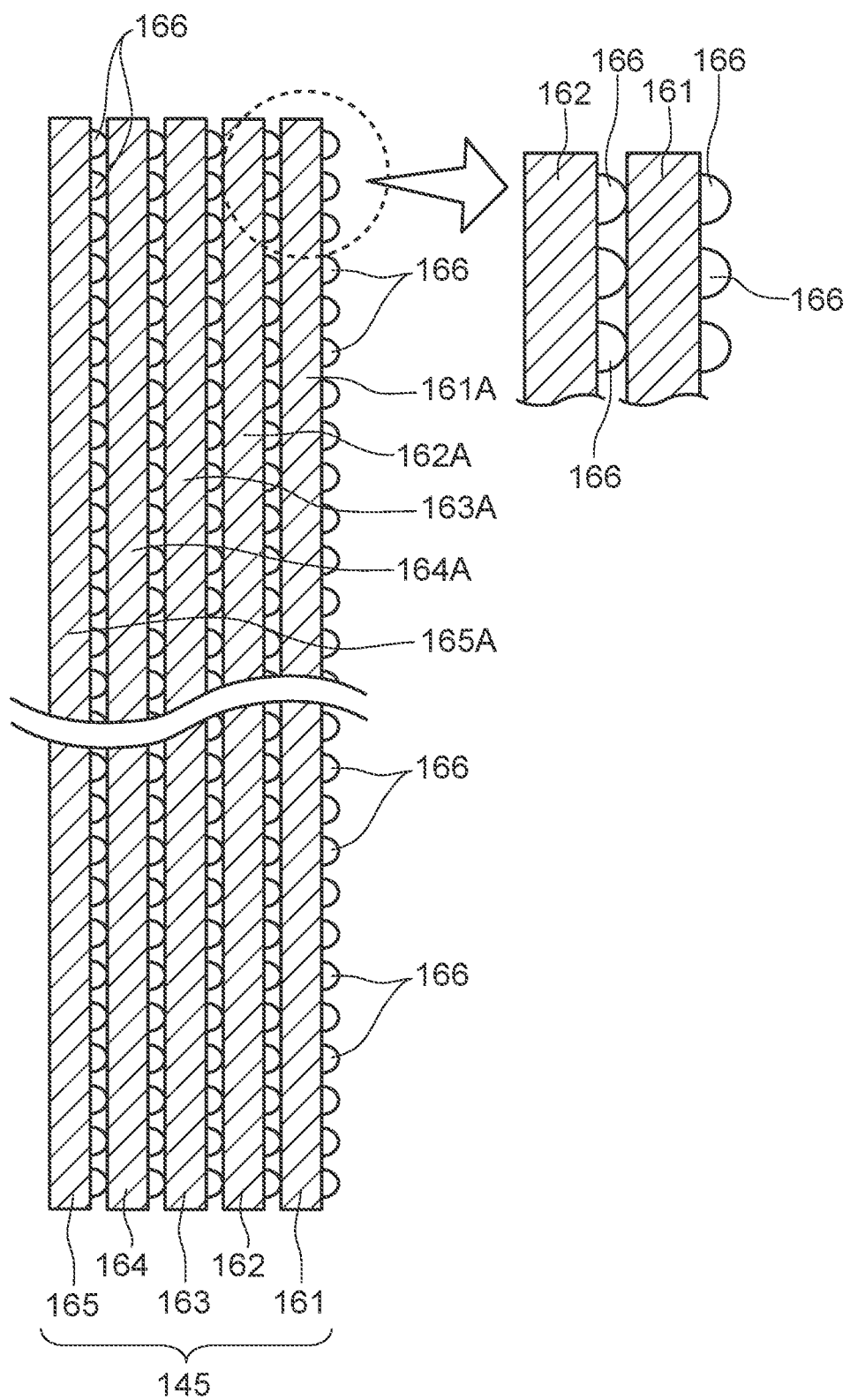
FIG. 12 is a sectional view taken along the line 12-12 in FIG. 10.
Figure 13:
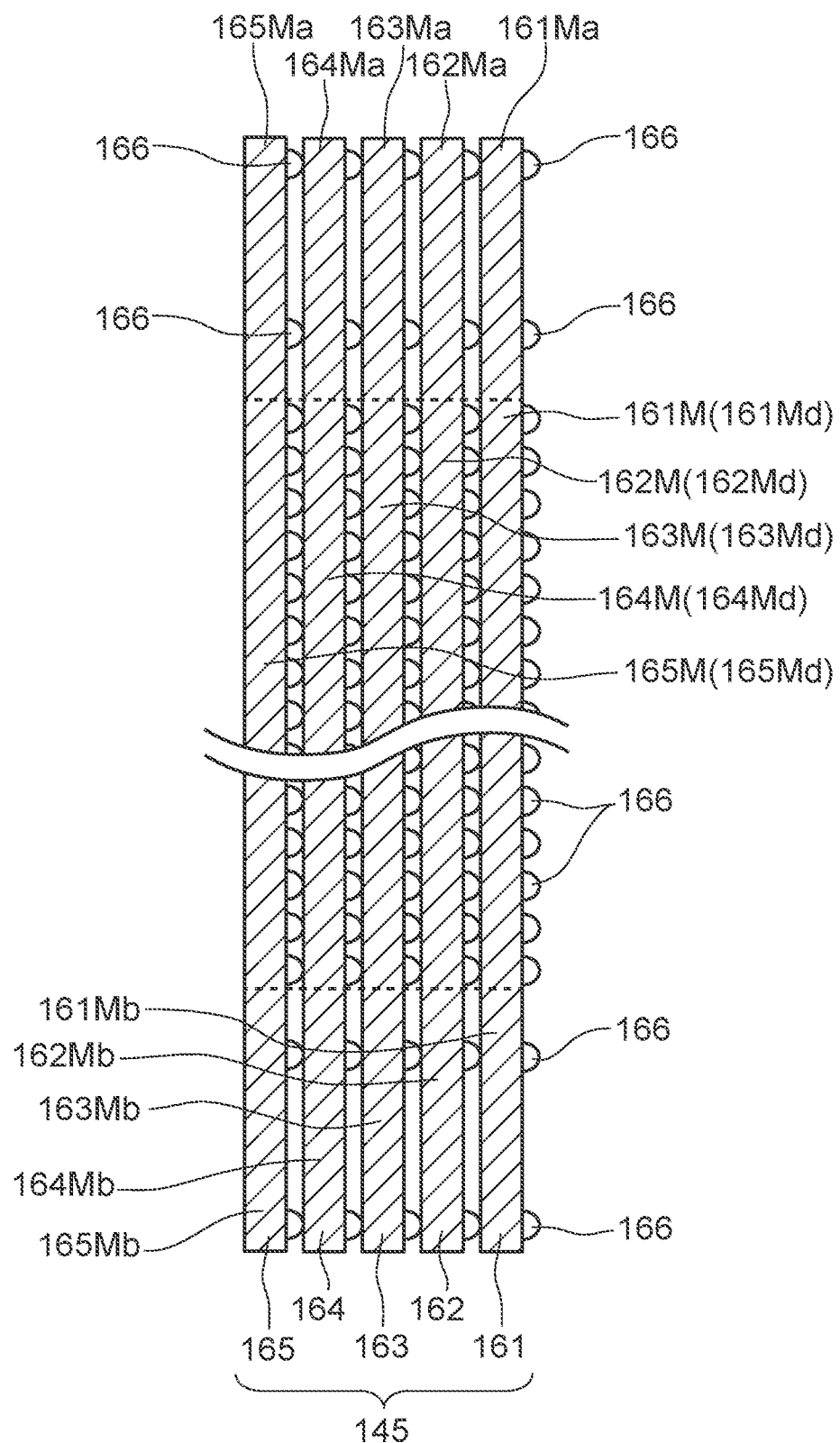
FIG. 13 is a sectional view taken along the line 13-13 in FIG. 10.
Figure 14:
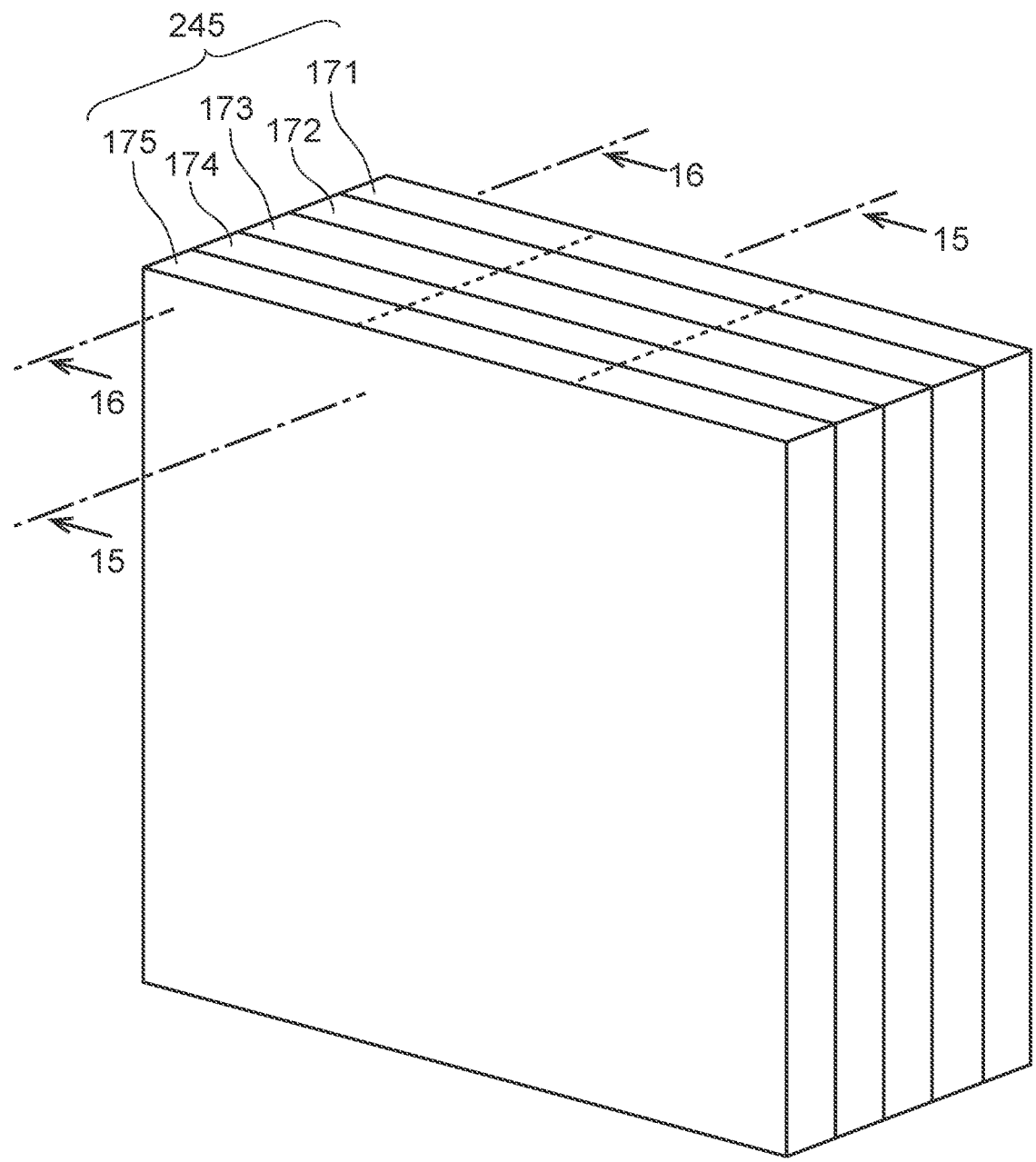
FIG. 14 is a perspective view showing the active layer according to the first modified example.

Subsequently, the light source-unit 360, the laser diode 130 will be explained with reference to FIG. 7 to FIG. 13, in addition to FIG. 6. Here, FIG. 7 is a perspective view showing the laser diode 130. FIG. 8 is a perspective view showing the laser diode 130 so as to clarify a stripe p-electrode 142 of the laser diode 130 and a stripe area 161M of an active layer 145. FIG. 9 is a perspective view showing an optical generating layer 150 being included in the laser diode 130. FIG. 10 is a perspective view showing the active layer 145 which is included in the optical generating layer 150. FIG. 11 is a perspective view showing the active layer 145, seen from a quantum dot layer 161. FIG. 12 is a sectional view taken along the line 12-12 in FIG. 10. FIG. 13 is a sectional view taken along the line 13-13 in FIG. 10.

As illustrated in FIG. 6, the light source-unit 360 includes the laser diode 130 and the sub-mount 350. The laser diode 130 is joined to the sub-mount 350 to constitute the light source-unit 360.

The laser diode 130 is joined to the sub-mount 350 with a later-described joining metal. Further, the laser diode 130 is joined to the sub-mount 350 so that the later-described stripe p-electrode 142 opposes to a later-described surface insulating layer 350a (a joint-surface 351) of the sub-mount 350. Therefore, a joint-metal layer 151 is formed between the stripe p-electrode 142 and the surface insulating layer 350a (a joint-surface 351).

As illustrated in FIG. 6, FIG. 7, the laser diode 130 has an n-substrate 140, a n-electrode 141, the optical generating layer 150, insulating layers 148a, 148b, a p-cladding layer 149 and the stripe p-electrode 142, having a straight band-like shape.

The stripe n-electrode 141 is joined to a surface on the outside of the n-substrate 140. Further, the optical generating layer 150 is formed on a side of the n-substrate 140 opposite to the stripe n-electrode 141, and the insulating layers 148a, 148b and the p-cladding layer 149 are formed on the optical generating layer 150. Further, the stripe p-electrode 142 is formed on the surface on the outside of the p-cladding layer 149. The p-cladding layer 149 is a part, having a straight band-like shape, and it is also called "stripe". The p-cladding layer 149 confines the injected current flow direction, and movements of electrons and holes, inside the laser diode 130.

As illustrated in FIG. 7, FIG. 9 in detail, the optical generating layer 150 includes the active layer 145, being a pn junction layer, an n-cladding layer 147 and a p-cladding layer 146. The optical generating layer 150 has a structure in which the active layer 145 is sandwiched between the n-cladding layer 147 and the p-cladding layer 146.

Then, as illustrated in FIG. 5, the sub-mount 350 is fixed to the side surface 5c of the convex part 5b so that a laser light emitting part 145A of the active layer 145 (see FIG. 7) opposes to the MEMS scanner 7.

As described later, as illustrated in FIG. 10, because the active layer 145 includes five quantum dot layers 161 to 165, the five quantum dot layers 161 to 165, constituting the active layer 145, oppose to the MEMS scanner 7, in the laser radar devices 100. Note that the laser light emitting part 145A is a part, of the laser diode 130, which a laser light L is emitted.

The sub-mount 350 is made of a silicon (Si), for example, and it is formed in a rectangular parallelepiped shape. As illustrated in, FIG. 6, the sub-mount 350 has a size larger than the laser diode 130. Further, the sub-mount 350 is able to be formed with semiconductor material such as GaAs, SiC or the like, or a ceramic material such as aluminum oxide-titanium carbide ($Al_2O_3 \cdot TiC$) or the like.

Then, as illustrated in FIG. 6 in detail, the sub-mount 350 has the surface insulating layer 350a made silicon dioxide ($SiO_2$). The surface of the surface insulating layer 350a constitutes the joint-surface 351 which the laser diode 130 is joined. The joint-surface 351 is formed in a flat rectangular shape. The joint-surface 351 has a size larger than the laser diode 130.

(Active Layer)

Next, the active layer 145 will be explained with reference to FIG. 10 to FIG. 13, in addition to FIG. 6 to FIG. 8.

As illustrated in FIG. 10, the active layer 145 includes the five quantum dot layers 161, 162, 163, 164, 165. The active layer 145 has a multi-layered structure which the five quantum dot layers 161 to 165 are stacked. The quantum dot layer 161 is arranged in a position, closest to the stripe p-electrode 142, and the quantum dot layer 165 is arranged in a position, closest to the n-electrode 141, among the quantum dot layers 161 to 165.

As illustrated in FIG. 11 to FIG. 13, a plurality of quantum dots 166 are formed in the respective quantum dot layers 161 to 165. The respective quantum dots 166 are particles made of semiconductor, having about several nm (nanometer) size. In the active layer 145, carriers (electrons or positive holes) are confined in minute areas of the quantum dots 166. Movements of the carriers are confined in the three-dimensional directions by the respective quantum dots 166.

As illustrated in FIG. 11, FIG. 13, the quantum dot layers 161 to 165 respectively include stripe-areas 161M, 162M, 163M, 164M, 165M. The stripe-areas 161M to 165M are areas, respectively having band-like shapes, being arranged in around the center of the respective quantum dot layers 161 to 165.

As illustrated in FIG. 8, the stripe-areas 161M to 165M are formed in the positions, corresponding to the stripe p-electrode 142, of the respective quantum dot layers 161 to 165. In FIG. 8, part of band-like shape, which dots are shown, is corresponding to the stripe-areas 161M to 165M.

Further, as illustrated in FIG. 11, FIG. 12, the outer areas than the stripe-areas 161M, 162M, 163M, 164M, 165M (the areas except for the stripe-areas 161M, 162M, 163M, 164M, 165M) are side-areas 161A, 162A, 163A, 164A, 165A, in the respective quantum dot layers 161, 162, 163, 164, 165.

Then, as illustrated in FIG. 11, FIG. 13, window-areas 161Ma, 161Mb, 162Ma, 162Mb, 163Ma, 163Mb, 164Ma, 164Mb, 165Ma, 165Mb are formed in the respective stripe-areas 161M, 162M, 163M, 164M, 165M. The window-areas 161Ma, 161Mb to 165Ma, 165Mb are areas, of the respective stripe-areas 161M to 165M, corresponding to the laser light emitting part 145A and areas of rear side (for example, rectangular area, illustrated in FIG. 11). Because the window-areas 161Ma to 165Ma are areas (front facets) corresponding to the laser light emitting part 145A, the laser light L is emitted from the window-areas 161Ma to 165Ma. The window-areas 161Mb to 165Mb are areas (rear facets), arranged rear side of the window-areas 161Ma to 165Ma, they are the areas where photons reflect inside the laser diode 130 without light emitting out.

In the active layer 145, the quantum dot layers 161 to 165 respectively include the window-areas 161Ma, 161Mb to 165Ma, 165Mb. Therefore, the quantum dot layers 161 to 165 correspond to window-formed quantum dot layers according to the present invention. The active layer 145 has a multi-layer structure which the window-formed quantum dot layers are stacked.

Then, in the active layer 145, the respective window-areas 161Ma, 161Mb to 165Ma, 165Mb are low-density areas, in the respective quantum dot layers 161 to 165. The low-density areas mean the areas which arrangement density of the quantum dots 166 are lower than the other areas. Concerning the arrangement density of the quantum dots 166, the respective window-areas 161Ma, 161Mb to 165Ma, 165Mb are lower than the areas except for the window-areas 161Ma, 161Mb to 165Ma, 165Mb. The arrangement density of the quantum dots 166 is able to be decided in accordance with the number of the arranged quantum dots 166 per unit area.

As illustrated in FIG. 11 to FIG. 13, in the side-areas 161A to 165A and middle areas 161Md, 162Md, 163Md, 164Md, 165Md, of the stripe-areas 161M to 165M, except for the window-areas 161Ma, 161Mb to 165Ma, 165Mb, a large number of quantum dots 166 are arranged and a large number of quantum dots 166 are congested. These areas are congested areas CR. On the other hand, in the window-areas 161Ma, 161Mb to 165Ma, 165Mb, quantum dots 166 are arranged discretely. Therefore, the window-areas 161Ma, 161Mb to 165Ma, 165Mb are discrete areas SR.

Here, FIG. 6, FIG. 7 are referred. The joint-metal layer 151 is formed with the joining metal. The joining metal is a metal which is used for joining the laser diode 130 and the sub-mount 350. In case of the light source-unit 360, for example, solder (alloy metal including tin), tin (Sn) and gold (Au) are able to be used as the joining metal. When tin (Sn) and gold (Au) are used as the joining metal, alloy layer, made of alloy (AuSn alloy) including tin and gold, and metal layer, including gold, are included in the joining metal layer 151.

(Operation and Effect of the Light Source-Unit, the Laser Diode)

As described above, as illustrated in FIG. 6, the laser diode 130 is joined to the sub-mount 350, thereby the light source-unit 360 is manufactured. As illustrated in FIG. 10, the active layer 145, of the laser diode 130 includes the five quantum dot layers 161 to 165, a plurality of quantum dots 166 are formed in the respective quantum dot layers 161 to 165, as illustrated in FIG. 11. The quantum dots 166 are semiconductor particles confining movements of the carriers (electrons or positive holes) in the three-dimensional directions.

In general, the structure, which the carriers are confined in the extremely narrow areas, is called a quantum well (QW). In the quantum well, movements of the carriers are confined in the one-dimensional direction. The quantum well, in this case, is constituted by a plane thin-film, made of semiconductor, having an extremely thin thickness.

By the way, in general, when the active layer changes from a bulk semiconductor to the quantum well, density of state, which shows the number of seats of carriers, changes. In the bulk semiconductor, density of state shows a continuous parabolic shape though, in the quantum well, density of state shows a step like shape. The peaks of light emission wavelength occur at the steps in step like shape, and width of light emission wavelength is narrowed. This point is a characteristic of the case which the active layer is the quantum well.

Then, the active layer 145, of the light source-unit 360 according to the embodiment, includes the quantum dot layers 161 to 165. The quantum dots 166 of the respective quantum dot layers 161 to 165 confine movements of the carriers in the three-dimensional directions. In case of the quantum well, dimension of quantization is one dimension though, in case of the active layer 145, because quantum dots 166 are formed in the respective quantum dot layers 161 to 165, dimension of quantization evolves into three dimensions Then, because dimension of quantization evolves into three dimensions from one dimension, in the active layer 145, density of state is more discrete than the quantum well in one dimension. Namely, in the active layer 145, existence of the carries is concentrated in specific energy states, because of including the quantum dots 166.

On the other hand, Fermi distribution function, which shows energy distribution of electrons, has temperature dependency, distribution of carriers varies in accordance with temperature. Therefore, the characteristic of the laser diode varies in accordance with temperature.

However, in case of the laser diode 130, because dimension of quantization evolves into three dimensions from one dimension, in the active layer 145, density of state is discretized, thereby existence of the carries is concentrated in the specific energy states. Thereby, even if Fermi distribution function varies in accordance with the change of temperature, density of state, being seats of carriers, is fixed in the specific energy positions.

Accordingly, in case of the laser diode 130 including the quantum dots 166, the effective carrier distribution hardly changes, even if temperature changes.

Thereby, in case of the laser diode 130, because variation of characteristics, in accordance with the change of temperature, hardly varies, the characteristic of temperature of the laser diode 130 is largely improved.

As described above, the active layer 145 includes the quantum dot layers 161 to 165, which the quantum dots 166 are respectively formed, thereby, the laser diode 130 is devised so as to be insensible to temperature.

On the other hand, in case of the laser radar devices 100, including the laser diode 130, when the power source of the vehicle 400 is working (especially, the vehicle is driving), heat by the working of the power source is conveyed to the laser radar devices 100. Therefore, the laser radar devices 100 are placed in the environment which change of temperature occurs easily.

However, as described-above, because the laser diode 130 is devised so as to be insensible to temperature, the mode hopping of the laser diode 130 is hard to occur. Therefore, the quality of vehicle control by the laser radar devices 100 is difficult to be lowered, the quality of vehicle control is stable.

On the other hand, because the quantum dots 166 are respectively minute semiconductor particles, intensity of the laser light L, being obtained from the respective quantum dots 166, is extremely small.

However, a mass of quantum dots 166, constituted by the multi-layered structure including the quantum dot layers 161 to 165, is formed, in the laser diode 130. Thereby, light emission intensity of the laser light L, in the light source-unit 360, is enhanced.

Further, the respective quantum dot layers 161 to 165 includes the stripe-areas 161M to 165M, in accordance with the stripe p-electrode 142, in the light source-unit 360. Therefore, population inversion, which is necessary for stimulated emission, is formed along by the stripe-areas 161M to 165M, thereby the laser light L is guided along by the stripe-areas 161M to 165M.

Then, because the low-density areas are formed in the respective stripe-areas 161M to 165M, in the light source-unit 360, the arrangement densities of the quantum dots 166 are partially lowered, in the respective stripe-areas 161M to 165M. Then, movements of the carriers, between the stripe p-electrode 142 and the n-electrode 141, are confined, absorption of the laser light L is difficult to occur, in the stripe-areas 161M to 165M.

Moreover, the low-density areas are formed in the window-areas 161Ma, 161Mb to 165Ma, 165Mb of the stripe-areas 161M to 165M. Therefore, when the laser light L, generated inside the stripe-areas 161M to 165M, is emitted from the laser light emission part 145A, absorption of the laser light L is also difficult to occur. Accordingly, in the active layer 145, the laser light L is effectively emitted to outside. Thereby power consumption, in the light source-unit 360, is reduced. Further, the heat phenomena due to light absorption at the edge of the laser diode 130 can be suppressed, thereby the lifetime of the laser diode 130 can be improved.

Furthermore, the light source-unit 360 has the multi-layered structure which the quantum dot layers 161 to 165, as the window-formed quantum dot layers, are stacked. Therefore, both light emission intensity of the laser light L improving function by the multi-layered structure, and absorption of the laser light L lowering function by the window-formed structure are provided in the light source-unit 360.

First Modified Example

Next, the laser diode and the laser radar device, according to the first modified example, will be explained with reference to FIG. 14 to FIG. 18. The laser diode and the laser radar device, according to the first modified example, are respectively different in the active layer of the laser diode, as compared with the above-described laser diode 130 and the laser radar device 100. Namely, in case of the above-described laser diode 130 and the laser radar device 100, the laser diode 130 includes the active layer 145. On the other hand, in case of the laser diode and the laser radar device, according to the first modified example, the laser diode includes an active layer 245, illustrated in FIG. 14 to FIG. 17.

The active layer 145 includes the five quantum dot layers 161, 162, 163, 164, 165. To the contrary, the active layer 245 includes the five quantum dot layers 171, 172, 173, 174, 175. The active layer 245 has the multi-layered structure which the five quantum dot layers 171 to 175 are stacked, similar with the active layer 145.

Further, as illustrated in FIG. 15 to FIG. 18, a plurality of quantum dots 166 are formed in the respective quantum dot layers 171 to 175, similar with the quantum dot layers 161 to 165.

However, the quantum dot layers 171 to 175 are respectively different in distribution of a plurality of quantum dots 166, as compared with the quantum dot layers 161 to 165.

Figure 15:
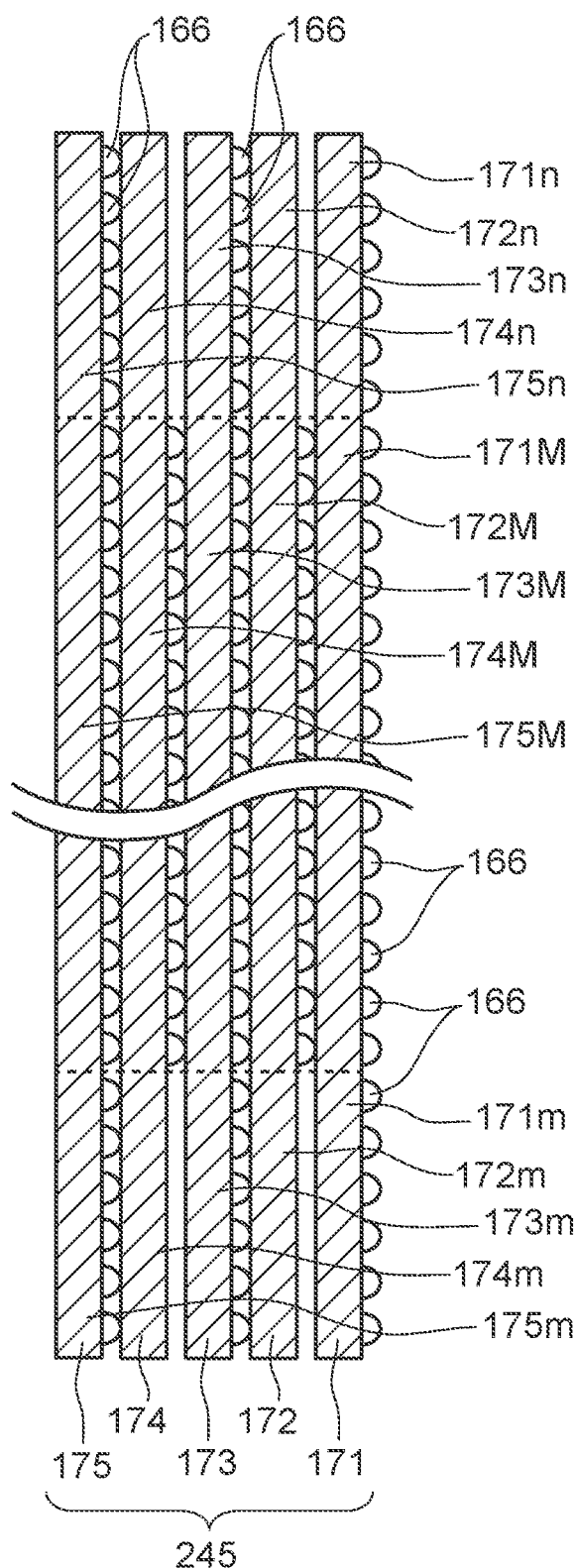
FIG. 15 is a sectional view taken along the line 15-15 in FIG. 14.

As illustrated in FIG. 15, in case of the active layer 245, the quantum dot layers 171, 173, 175 are even dot layers, the quantum dot layers 172, 174 are uneven dot layers. Namely, a plurality of quantum dots 166 are formed evenly in the almost whole of the respective quantum dot layers 171, 173, 175. To the contrary, the quantum dot layers 172, 174 are respectively include non-dot areas, in which the quantum dots 166 are not formed (the area illustrated by "nQD" in FIG. 18).

Then, as illustrated in FIG. 15, in case of the active layer 245, the quantum dot layers 171, 173, 175, being even dot layers, and the quantum dot layers 172, 174, being uneven dot layers, are alternately stacked.

Figure 16:
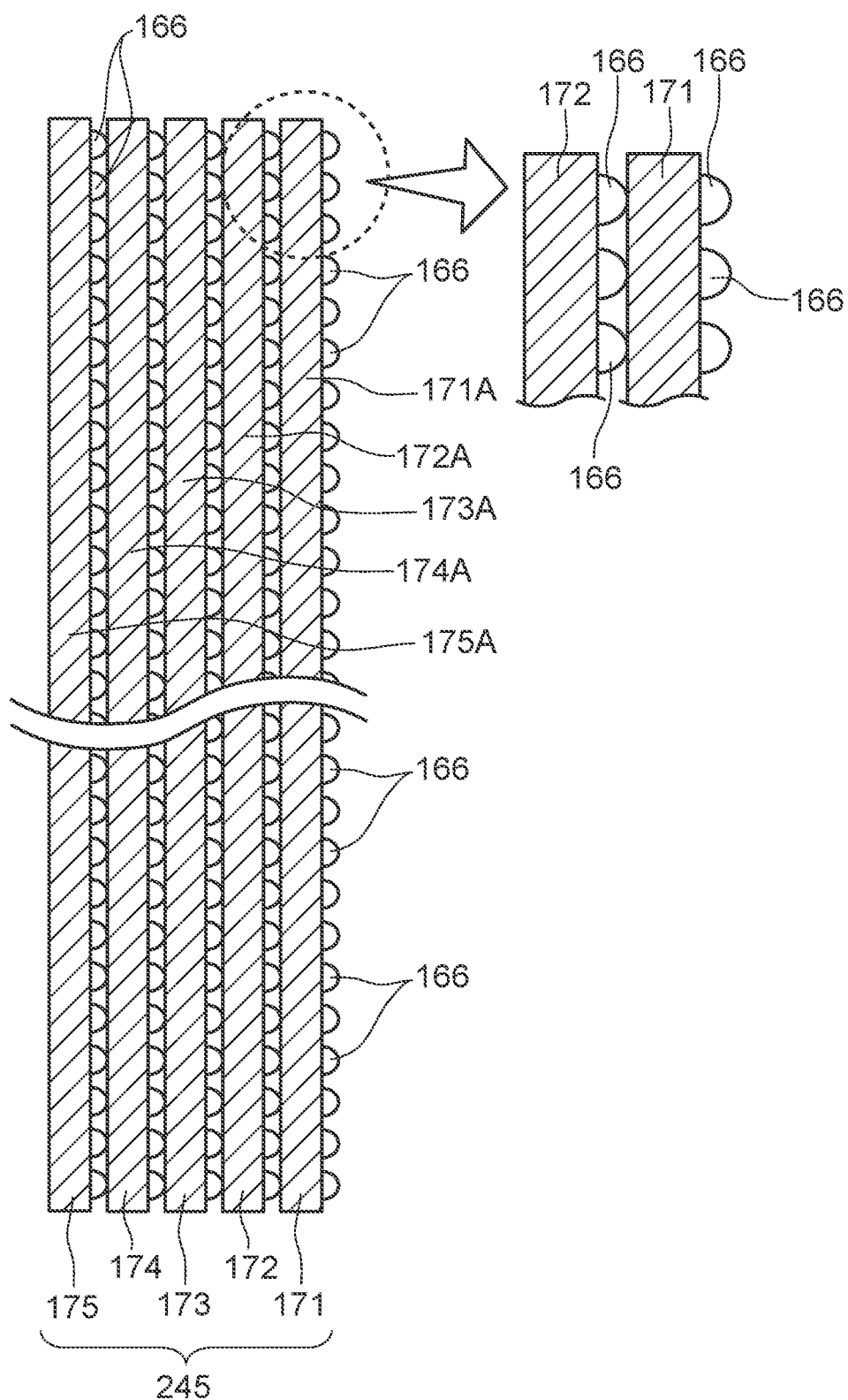
FIG. 16 is a sectional view taken along the line 16-16 in FIG. 14.
Figure 17:
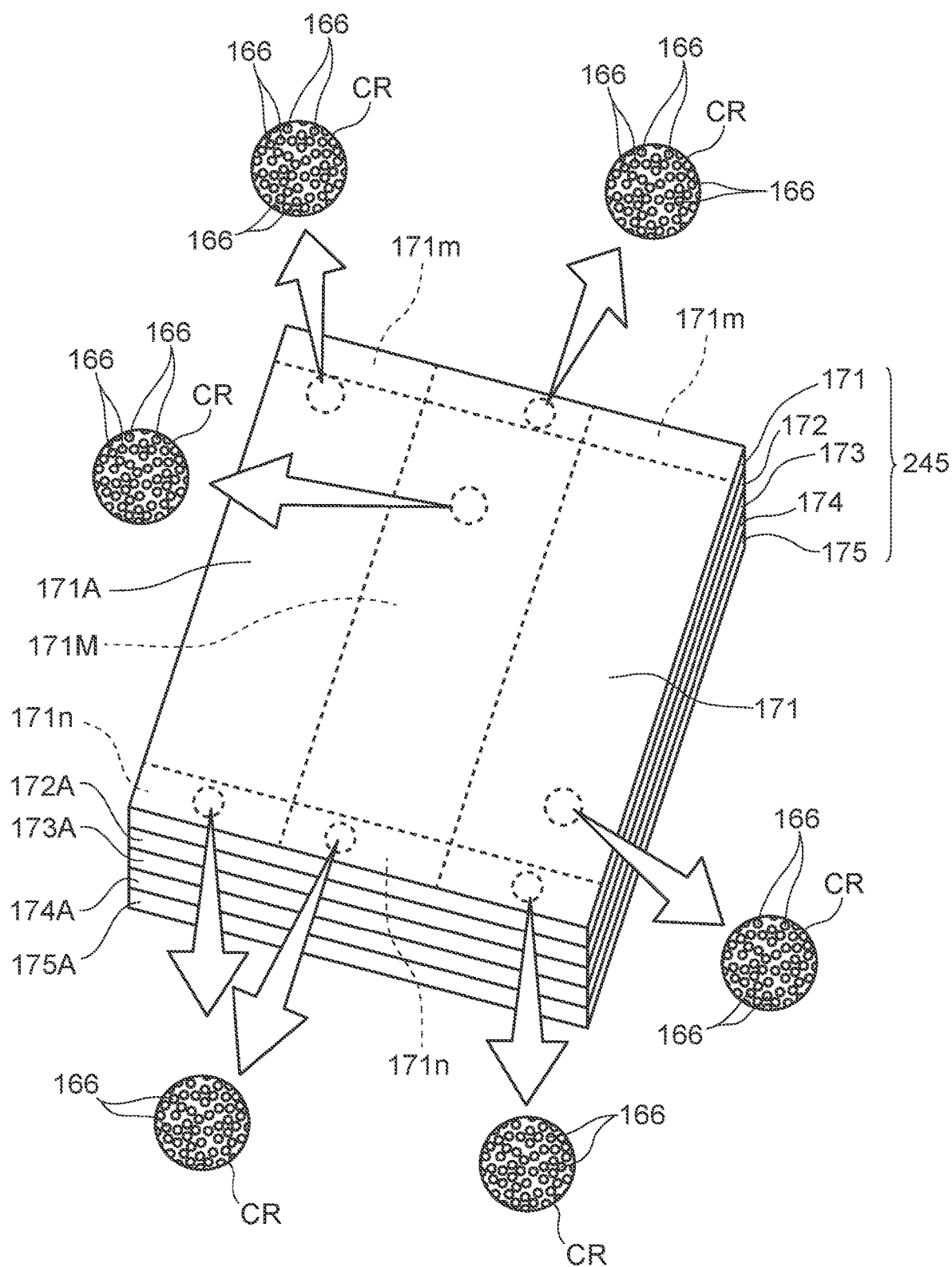
FIG. 17 is a perspective view showing the active layer, according to the first modified example, seen from a first layered quantum dot layer.

The quantum dot layers 171, 173, 175, as illustrated in FIG. 15 to FIG. 17, respectively include stripe-areas 171M, 173M, 175M and side-areas 171A, 173A, 175A. Further, the quantum dot layers 171, 173, 175 respectively include window-areas 171m, 171n, 173m, 173n, 175m, 175n.

In case of the above-described active layer 145, the window-areas 161Ma, 161Mb to 165Ma, 165Mb are discrete areas SR. However, in case of the quantum dot layers 171, 173, 175, all of the stripe-areas 171M, 173M, 175M, side-areas 171A, 173A, 175A and window-areas 171m, 171n, 173m, 173n, 175m, 175n are congested areas CR. Note that the window-areas 171m, 171n, 173m, 173n, 175m, 175n are areas, of the respective quantum dot layers 171, 173, 175, corresponding to the laser light emitting part 145A and areas of rear side (the window-areas 171m, 171n are illustrated in FIG. 17).

Figure 18:
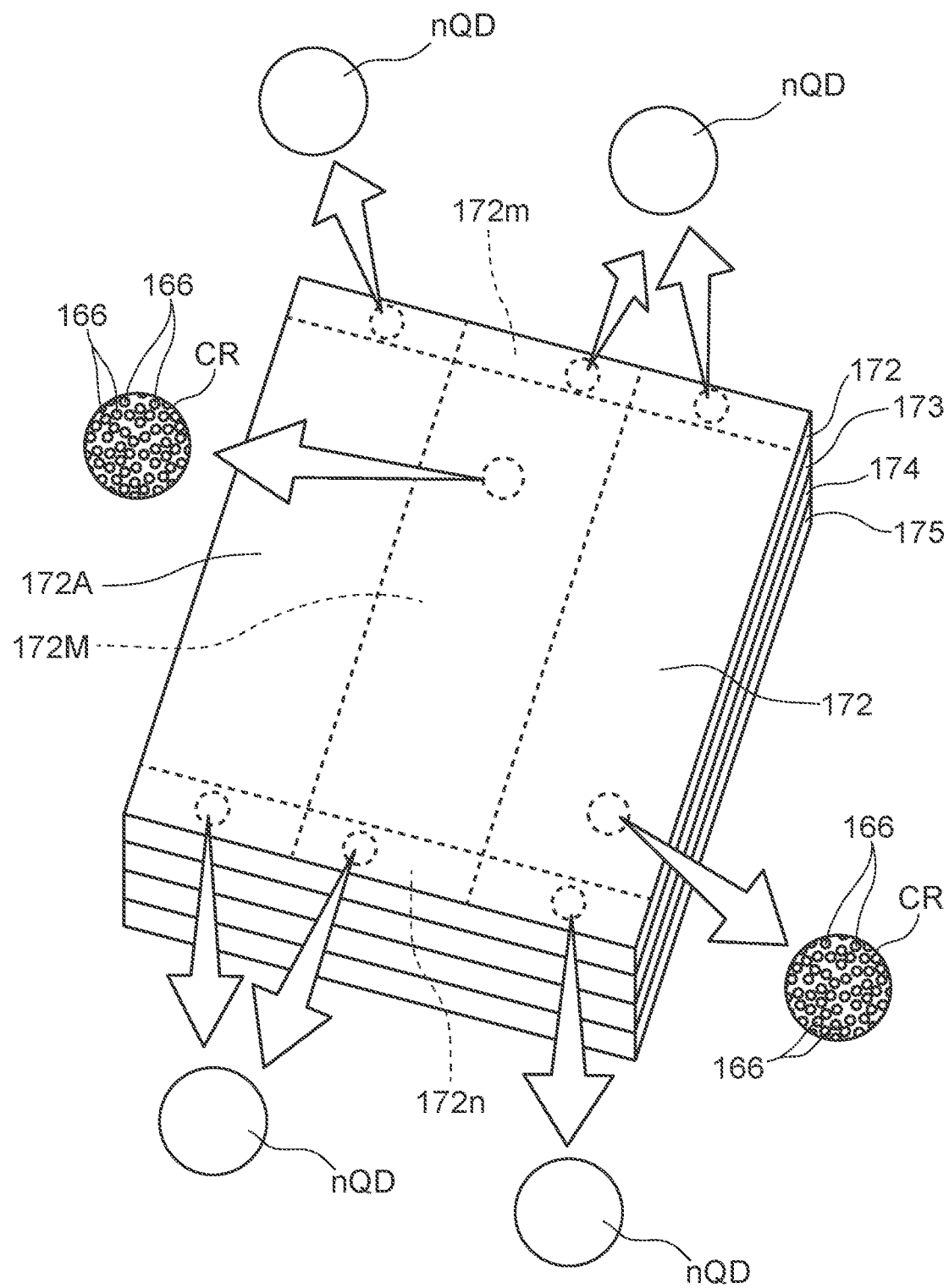
FIG. 18 is a perspective view showing the active layer, according to the first modified example, mainly showing the second layered quantum dot layer.
Figure 19:
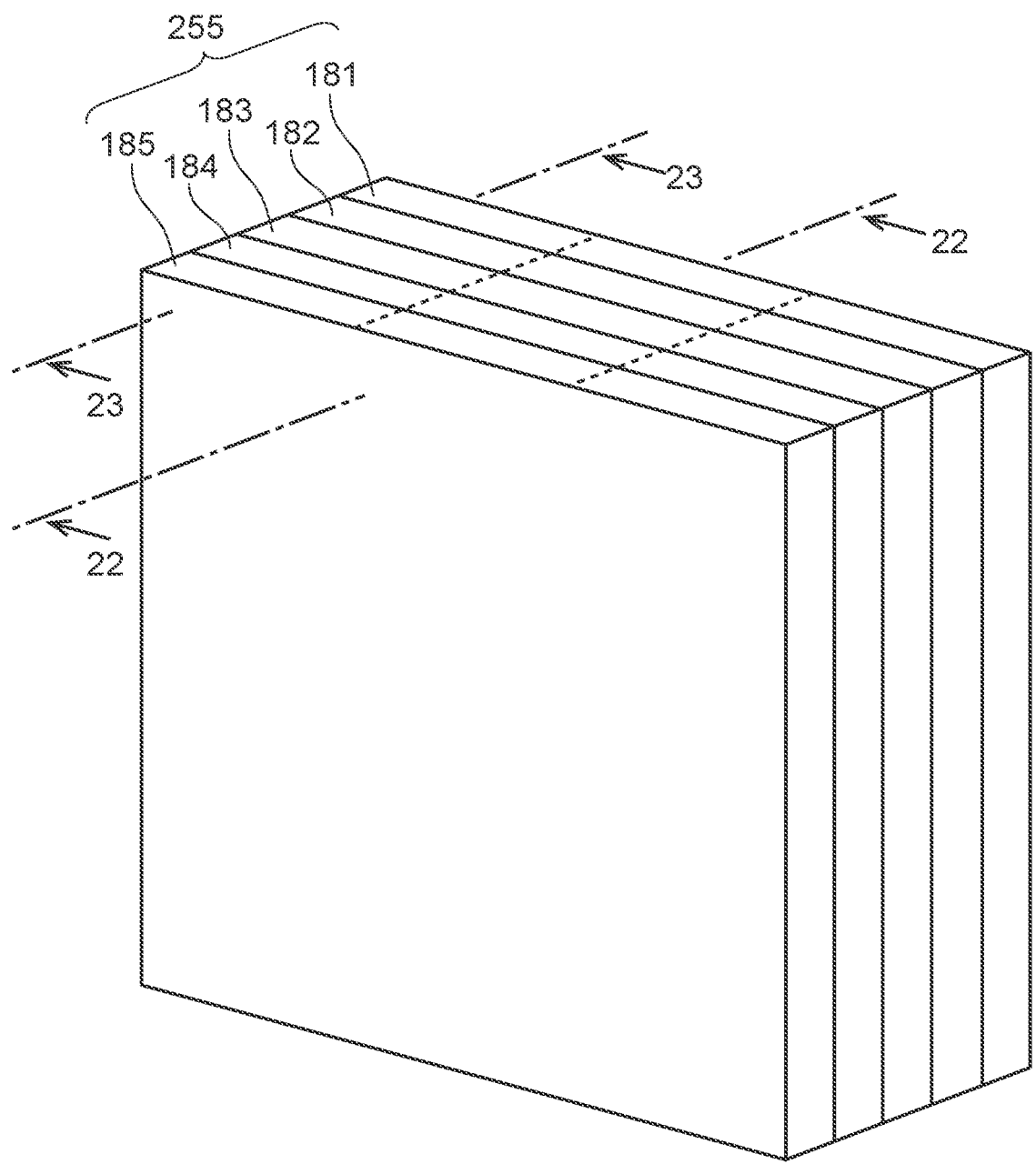
FIG. 19 is a perspective view showing the active layer according to the second modified example.

The quantum dot layers 172, 174, as illustrated in FIG. 15, FIG. 16, FIG. 18, respectively include stripe-areas 172M, 174M and side-areas 172A, 174A. Further, the quantum dot layers 172, 174 respectively include window-areas 172m, 172n, 174m, 174n.

Then, the above-described active layer 145 includes the window-areas 161Ma, 161Mb to 165Ma, 165Mb, being discrete areas SR, as the low-density areas.

However, the active layer 245 includes the window-areas 172m. 172n. 174m. 174n, being non-dot areas nQD, as the low-density areas. The window-areas 172m, 172n, 174m, 174n are non-dot areas nQD, because of not including the quantum dots 166 though, they are low-density areas, because arrangement densities of the quantum dots 166 are lower than the other areas.

As described above, the active layer 245 includes a plurality of quantum dots 166, similar with the active layer 145. Therefore, the laser diode (not illustrated), including the active layer 245, is devised so as to be insensible to temperature, similar with the laser diode 130, including the active layer 145. Therefore, in case of the laser radar devices (not-illustrated) including the active layer 245, the quality of vehicle control is also stable, without lowering, similar with the laser radar devices 100 including the active layer 145.

Further, the active layer 245 includes the multi-layered structure being formed by the quantum dot layers 171 to 175, similar with the active layer 145. Therefore, light emission intensity of the laser light L, in the laser diode including the active layer 245, is enhanced.

Furthermore, the active layer 245 includes the stripe-areas 171M to 175M, similar with the active layer 145, as illustrated in FIG. 18, parts of the stripe-areas 172M, 174M (window-areas 172m. 172n. 174m. 174n) are non-dot areas nQD. Therefore, movements of the carriers, between the stripe p-electrode 142 and the n-electrode 141, are confined, absorptions of the generated laser light L are hard to occur, in the stripe-areas 172M, 174M. Therefore, the laser light L is effectively generated in the active layer 245 as a whole. Thereby, power consumption, in the laser diode including the active layer 245, is reduced.

Further, because the window-areas 172m, 172n, 174m, 174n are non-dot areas nQD, absorption of the laser light L is hard to occur, in the window-areas 172m, 172n, 174m, 174n. Therefore, when the laser light L is emitted from the laser light emission part 145A of the active layer 245, absorption of the laser light L is also hard to occur. Accordingly, in the laser diode including the active layer 245, the laser light L is effectively emitted, power consumption is more reduced. Further, the heat phenomena due to light absorption at the edge of the laser diode including the active layer 245 can be suppressed, thereby the lifetime of the laser diode including the active layer 245 can be improved.

Second Modified Example

Next, the laser diode and the laser radar device, according to the second modified example, will be explained with reference to FIG. 19 to FIG. 23. The laser diode and the laser radar device, according to the second modified example, are respectively different in the active layer of the laser diode, as compared with the above-described laser diode 130 and the laser radar device 100. Namely, in case of the above-described laser diode 130 and the laser radar device 100, the laser diode 130 includes the active layer 145. On the other hand, in case of the laser diode and the laser radar device, according to the second modified example, the laser diode includes an active layer 255, illustrated in FIG. 19 to FIG. 23.

The above-described active layer 145 includes the five quantum dot layers 161 to 165. To the contrary, the active layer 255 includes the five quantum dot layers 181, 182, 183, 184, 185. The active layer 255 has the multi-layered structure which the five quantum dot layers 181 to 185 are stacked, similar with the active layer 145.

Further, as illustrated in FIG. 20 to FIG. 23, a plurality of quantum dots 166 are formed in the respective quantum dot layers 181 to 185, similar with the quantum dot layers 161 to 165.

However, the quantum dot layers 181 to 185 are respectively different in distribution of a plurality of quantum dots 166, as compared with the quantum dot layers 161 to 165.

Figure 21:
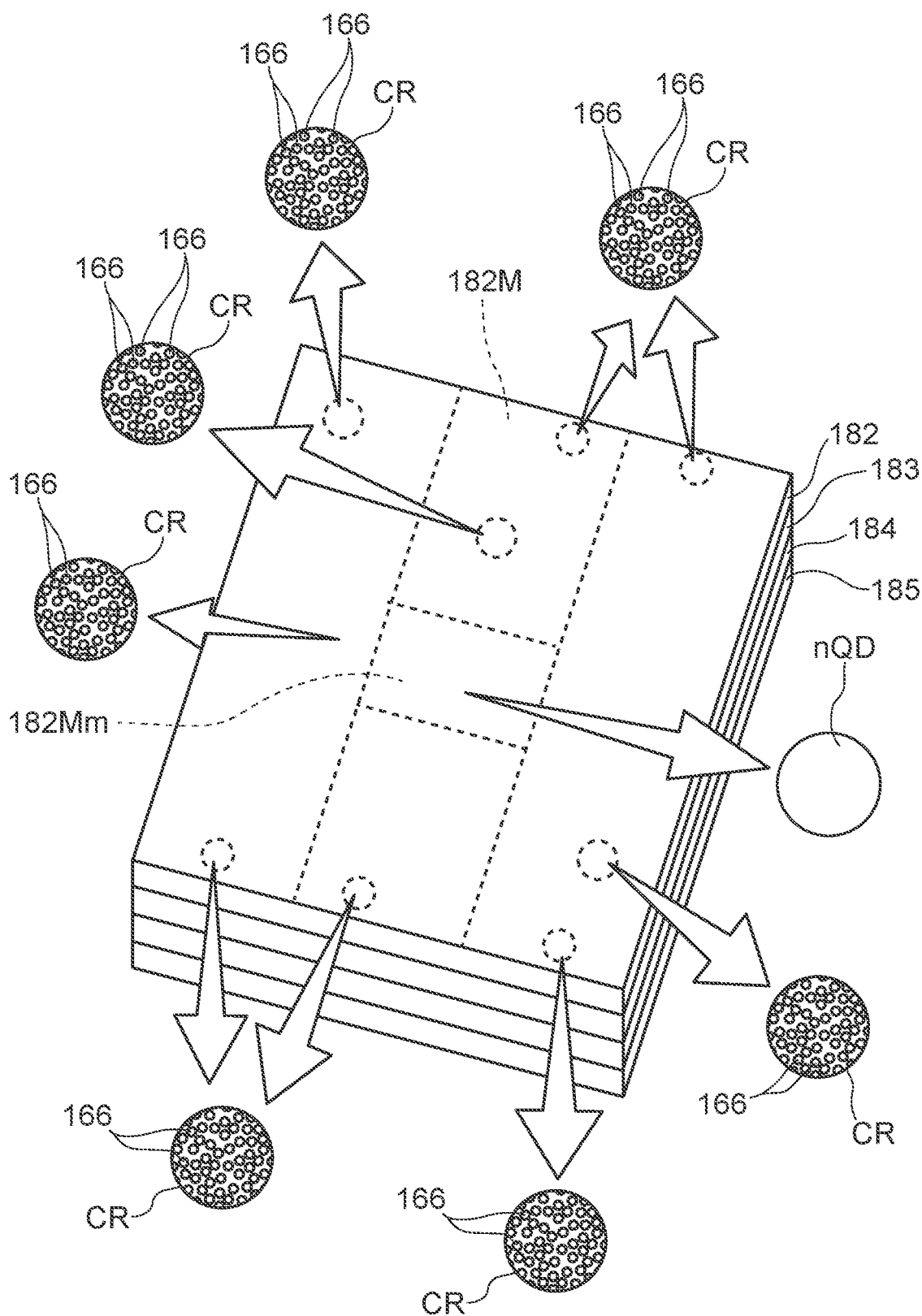
FIG. 21 is a perspective view showing the active layer, according to the second modified example, mainly showing the second layered quantum dot layer.
Figure 22:
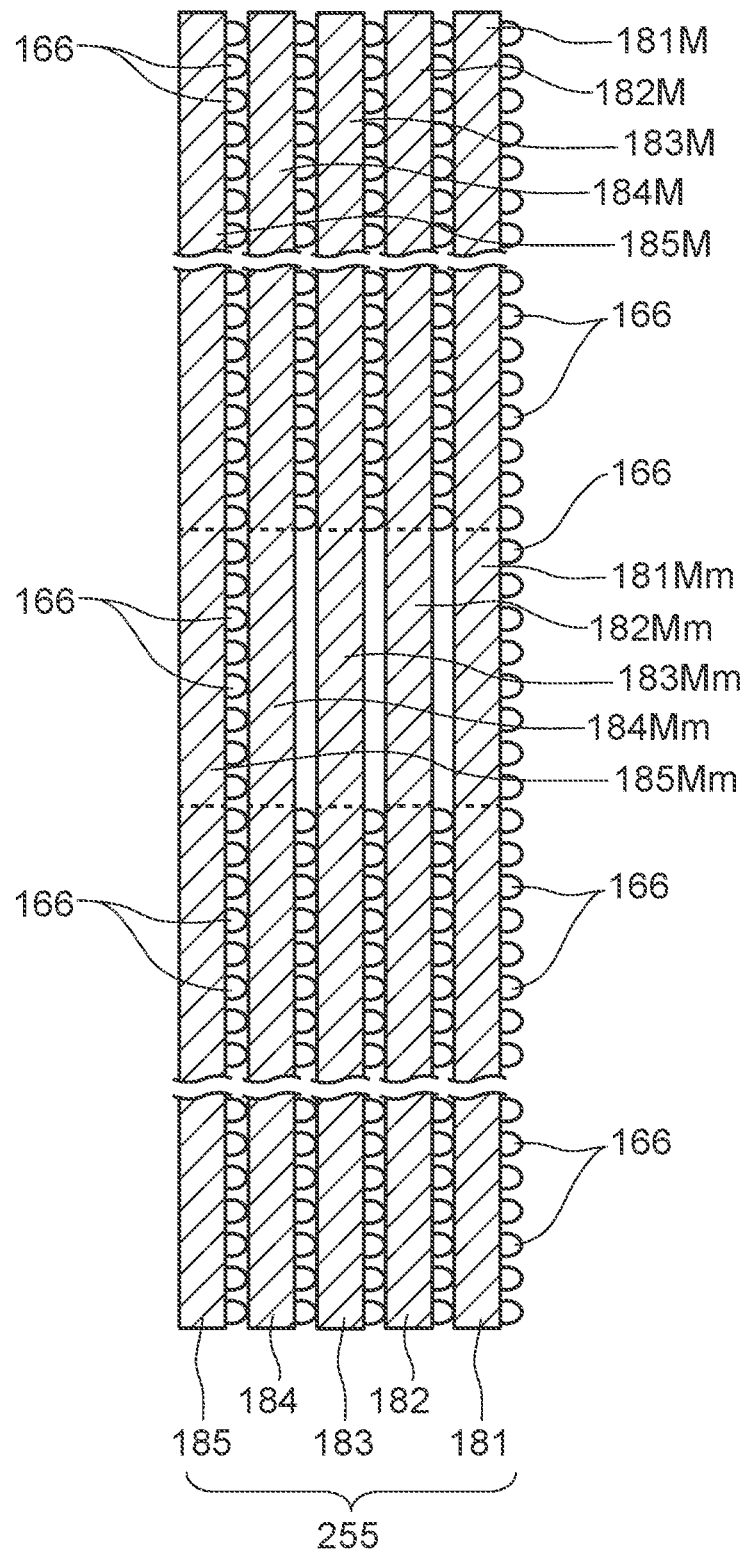
FIG. 22 is a sectional view taken along the line 22-22 in FIG. 19.
Figure 23:
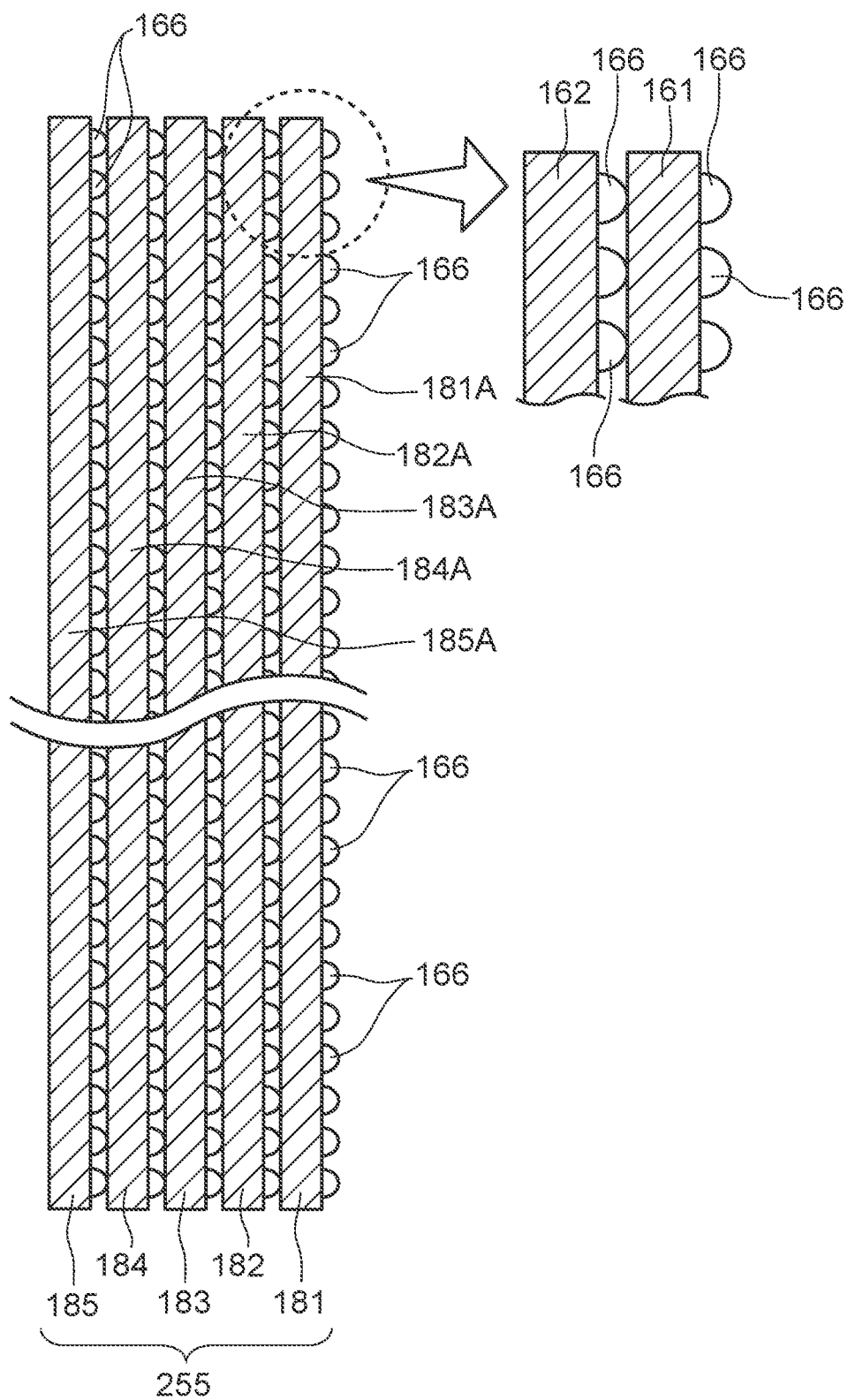
FIG. 23 is a sectional view taken along the line 23-23 in FIG. 19.
Figure 24:
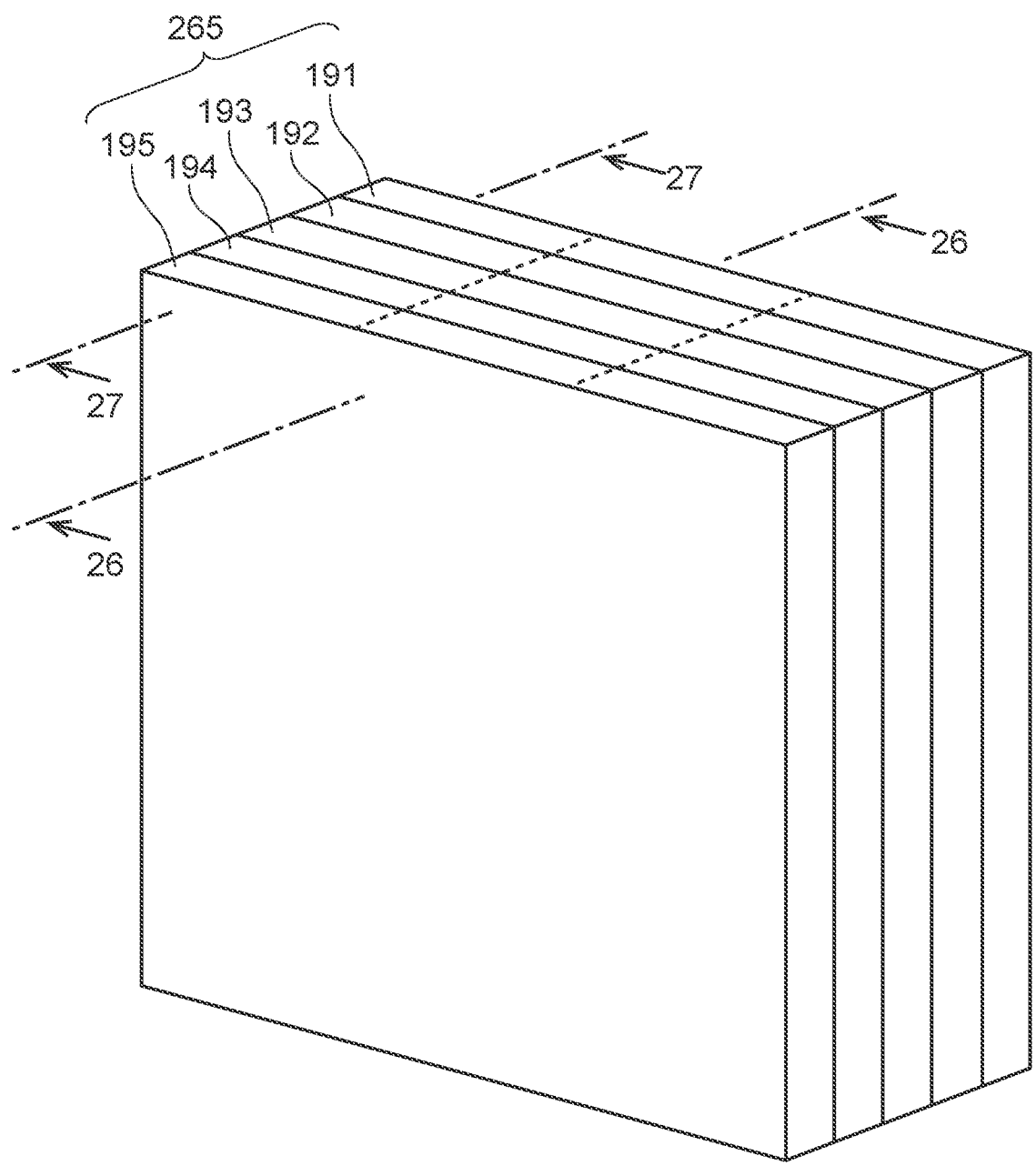
FIG. 24 is a perspective view showing the active layer according to the third modified example.

As illustrated in FIG. 22, in case of the active layer 255, the quantum dot layers 181, 185 are even dot layers, the quantum dot layers 182, 183, 184 are uneven dot layers. A plurality of quantum dots 166 are formed in almost the whole of the respective quantum dot layers 181, 185. To the contrary, the quantum dot layers 182, 183, 184 are respectively include non-dot areas, in which the quantum dots 166 are not formed (the area illustrated by "nQD" in FIG. 21).

Then, in case of the active layer 255, the quantum dot layers 181, 185, being even dot layers, are stacked so as to sandwich the quantum dot layers 182 to 184, being uneven dot layers.

Figure 20:
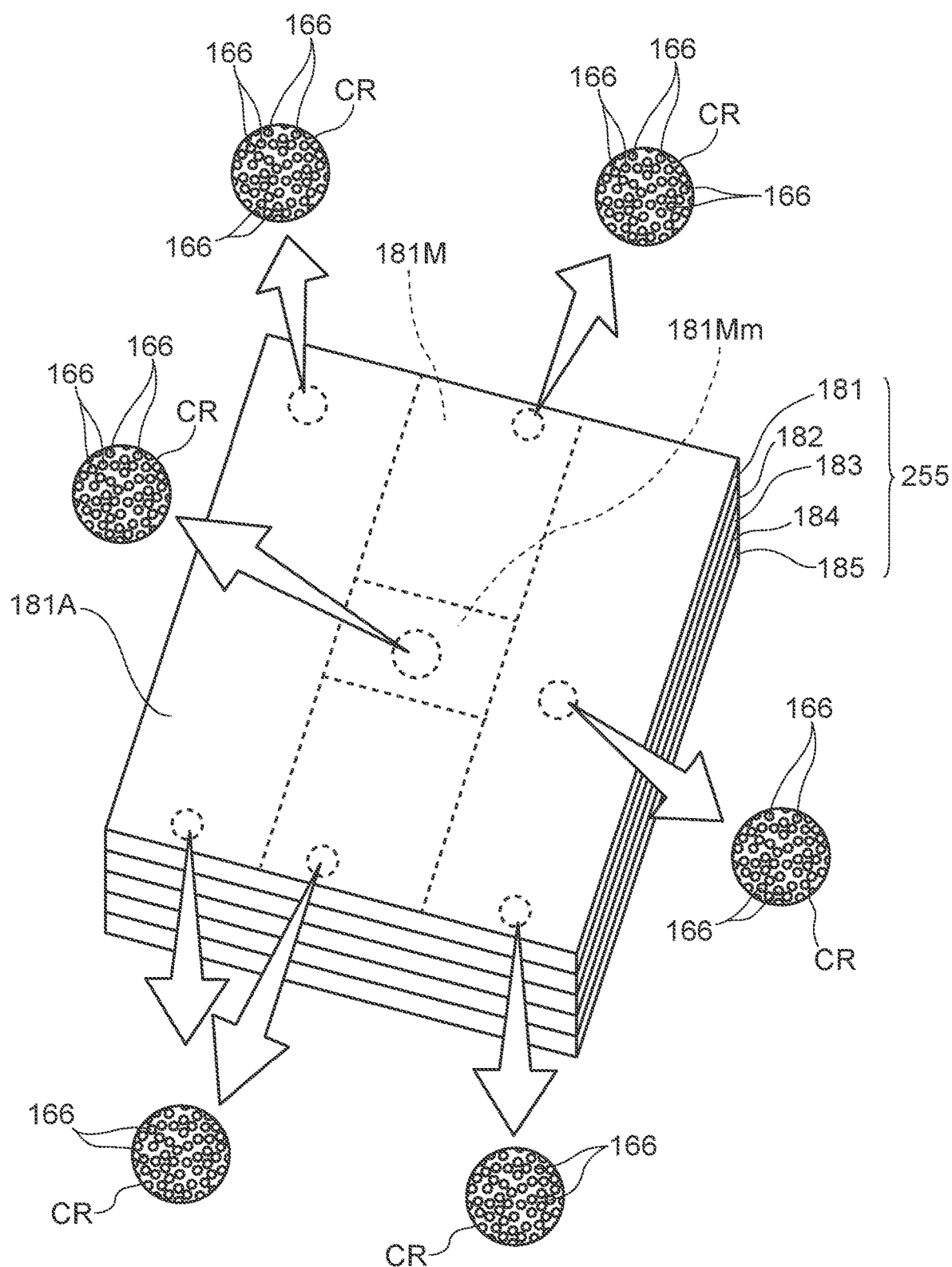
FIG. 20 is a perspective view showing the active layer, according to the second modified example, seen from the first layered quantum dot layer.

The quantum dot layers 181, 182, 183, 184, 185, as illustrated in FIG. 20, FIG. 22, respectively include stripe-areas 181M, 182M, 183M, 184M, 185M and side-areas 181A, 182A, 183A, 184A, 185A. Further, stripe-areas 181M, 182M, 183M, 184M, 185M include respectively center-areas 181Mm, 182Mm, 183Mm, 184Mm, 185Mm, and the center-areas 182Mm, 183Mm, 184Mm are formed in the non-dot areas nQD.

Then, the above-described active layer 145 include the window-areas 161Ma, 161Mb to 165Ma, 165Mb, being discrete areas SR.

However, in case of the quantum dot layers 181, 185, all areas including the stripe-areas 181M, 185M and side-areas 181A, 185A are congested areas CR. In case of the quantum dot layers 181, 185, all areas are congested areas CR. Further, in case of the quantum dot layers 182,183,184, the center-areas 182Mm, 183Mm, 184Mm are formed in the non-dot areas nQD.

Then, in case of the above-described active layer 145, the five quantum dot layers 161 to 165 respectively includes the window-areas 161Ma, 161Mb to 165Ma, 165Mb, being discrete areas SR, as the low-density areas.

To the contrary, as illustrated in FIG. 22, in case of the active layer 255, the quantum dot layers 182, 183, 184, of the five quantum dot layers 181 to 185, includes the center-areas 182Mm, 183Mm, 184Mm, being the non-dot areas nQD, as the low-density areas.

As described above, the active layer 255 includes a plurality of quantum dots 166, similar with the active layer 145. Therefore, the laser diode (not illustrated), including the active layer 255, is devised so as to be insensible to temperature, similar with the laser diode 130, including the active layer 145. Therefore, in case of the laser radar device (not-illustrated) including the active layer 255, the quality of vehicle control is also stable, without lowering, similar with the laser radar devices 100 including the active layer 145.

Further, the active layer 255 includes the multi-layered structure being formed by the quantum dot layers 181 to 185, similar with the active layer 145. Therefore, light emission intensity of the laser light L, in the laser diode including the active layer 255, is enhanced.

Further, the active layer 255 include the stripe-areas 181M to 185M, similar with the active layer 145, as illustrated in FIG. 21, parts of the stripe-areas 182M, 183M, 184M are the non-dot areas nQD. Therefore, movements of the carriers, between the stripe p-electrode 142 and the n-electrode 141, are confined, absorptions of the laser light L are hard to occur, in the stripe-areas 182M to 184M. Therefore, the laser light L is effectively generated in the active layer 255 as a whole. Thereby, power consumption, in the laser diode including the active layer 255, is reduced. Further, by controlling the size and location of the non-dot areas nQD, the laser beam shape can be controlled.

Third Modified Example

Next, the laser diode and the laser radar device, according to the third modified example, will be explained with reference to FIG. 24 to FIG. 27. The laser diode and the laser radar device, according to the third modified example, are respectively different in the active layer of the laser diode, as compared with the above-described laser diode 130 and the laser radar device 100. Namely, in case of the above-described laser diode 130 and the laser radar device 100, the laser diode 130 includes the active layer 145. On the other hand, in case of the laser diode and the laser radar device, according to the third modified example, the laser diode includes an active layer 265, illustrated in FIG. 24 to FIG. 27.

The above-described active layer 145 includes the five quantum dot layers 161 to 165. To the contrary, the active layer 265 includes the five quantum dot layers 191, 192, 193, 194, 195. The active layer 265 has the multi-layered structure which the five quantum dot layers 191 to 195 are stacked, similar with the active layer 145.

Figure 25:
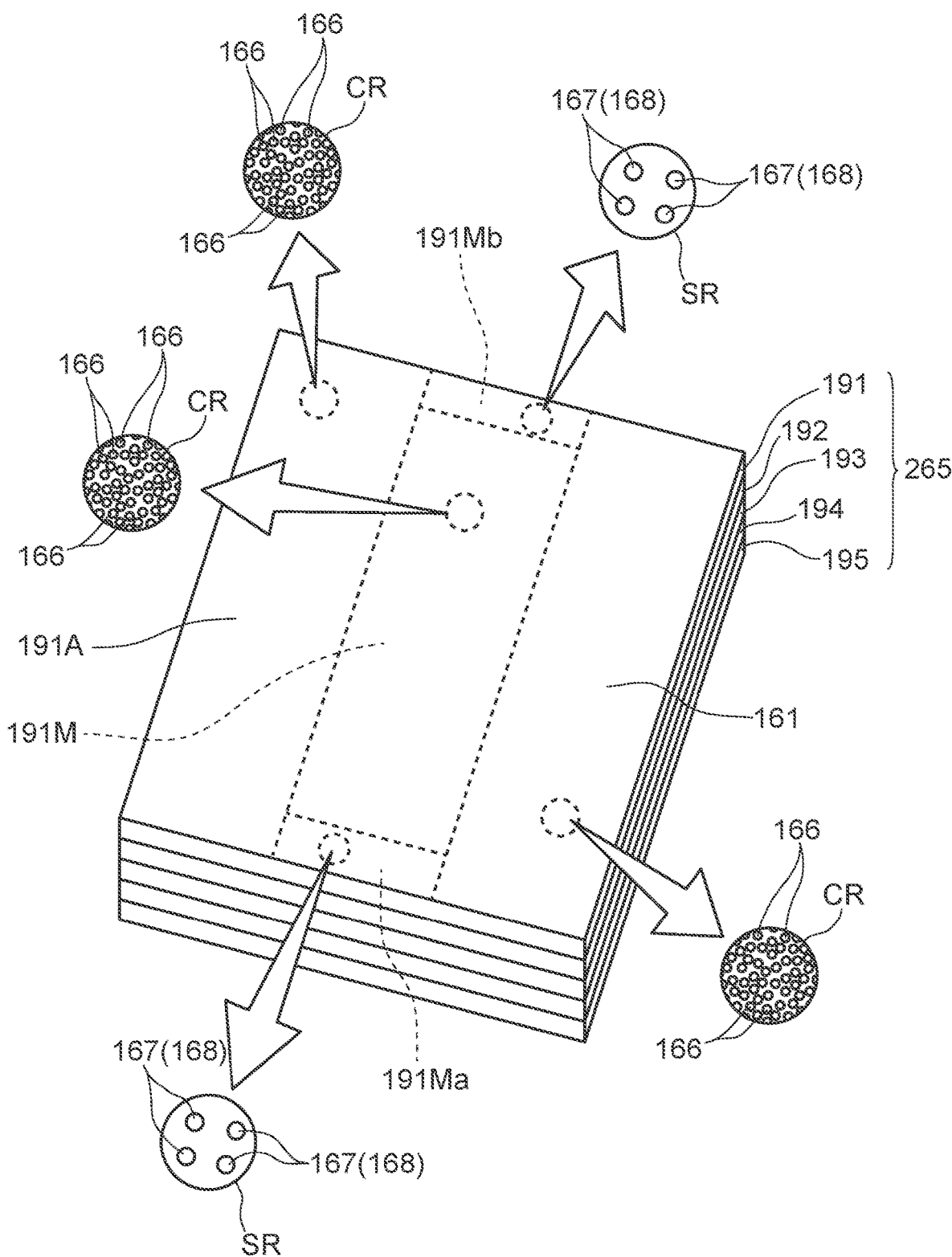
FIG. 25 is a perspective view showing the active layer, according to the third modified example, seen from the first layered quantum dot layer.
Figure 26:
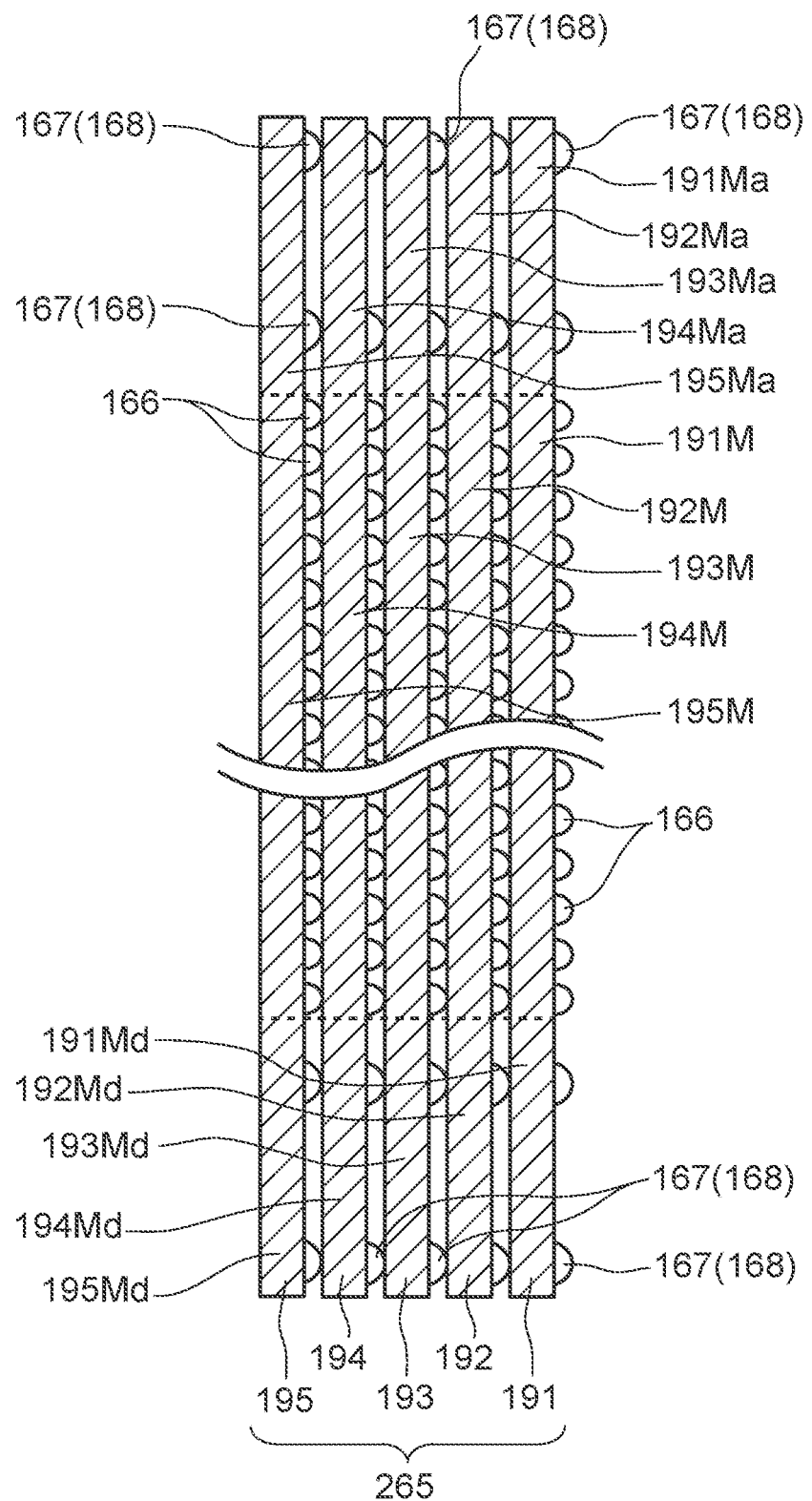
FIG. 26 is a sectional view taken along the line 26-26 in FIG. 24.
Figure 27:
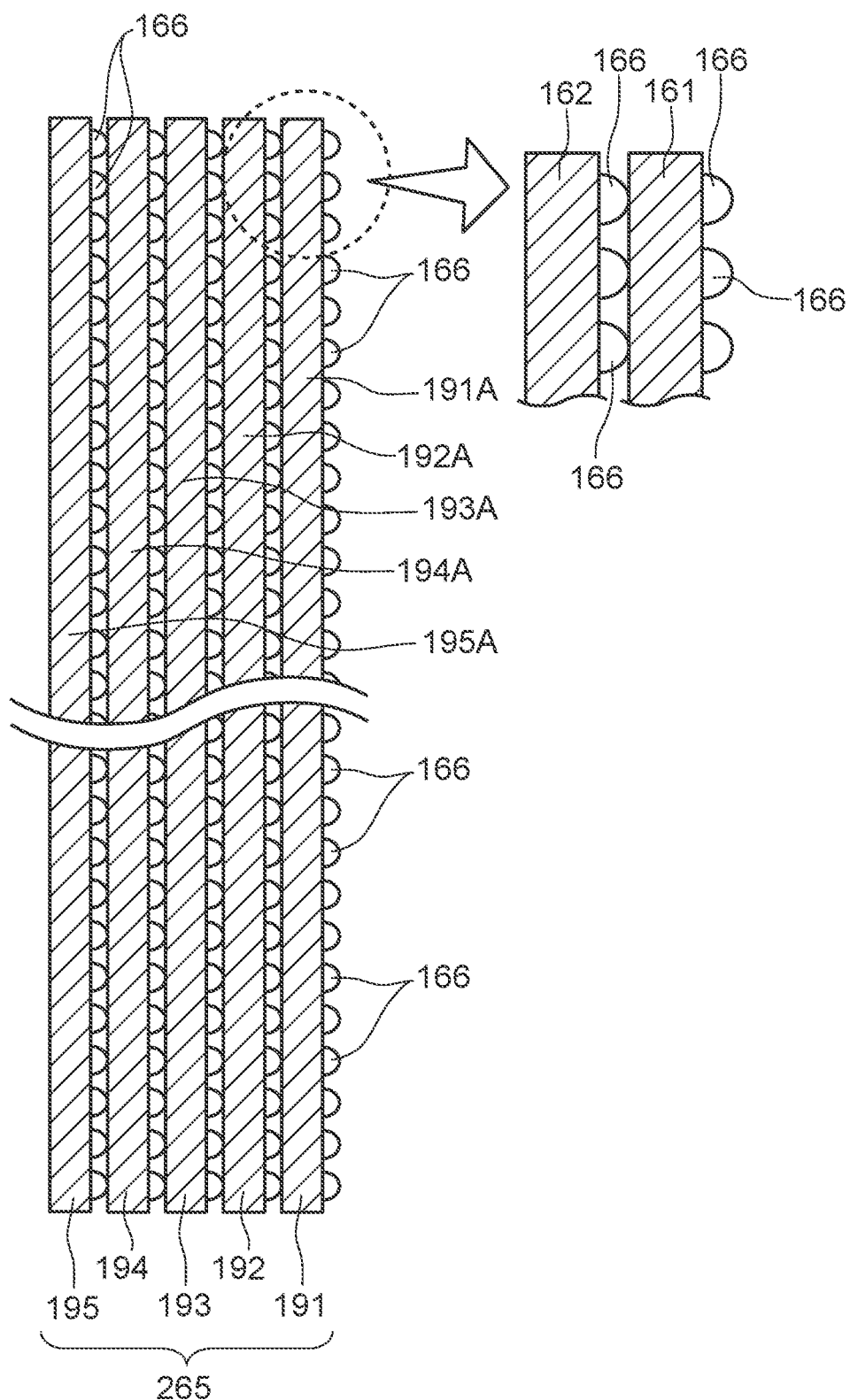
FIG. 27 is a sectional view taken along the line 27-27 in FIG. 24.

Further, as illustrated in FIG. 25 to FIG. 27, a plurality of quantum dots 166 are formed in the respective quantum dot layers 191 to 195, similar with the quantum dot layers 161 to 165. Further, the quantum dot layers 191 to 195 include later-described window-areas 191Ma, 191Mb to 195Ma, 195Mb, later-described quantum dots 167 are formed in the respective window-areas 191Ma, 191Mb to 195Ma, 195Mb.

The quantum dot layers 191 to 195, as illustrated in FIG. 25, FIG. 26, respectively include stripe-areas 191M, 192M, 193M, 194M, 195M and side-areas 191A, 192A, 193A, 194A, 195A, similar with the quantum dot layers 161 to 165.

Then, as illustrated in FIG. 25, FIG. 26, the window-areas 191Ma, 191Mb, 192Ma, 192Mb, 193Ma, 193Mb, 194Ma, 194Mb, 195Ma, 195Mb are formed in the respective stripe-areas 191M, 192M, 193M, 194M, 195M.

The quantum dots 167 are arranged discretely in the respective window-areas 191Ma, 191Mb to 195Ma, 195Mb. The respective window-areas 191Ma, 191Mb to 195Ma, 195Mb are discrete areas SR, similar with the window-areas 161Ma, 161Mb to 165Ma, 165Mb, and they are respectively low-density areas.

The quantum dots 167 have larger sizes than the quantum dots 166. Further, later-described quantum dots 168 are able to be formed in the respective window-areas 191Ma, 191Mb to 195Ma, 195Mb instead of the quantum dots 167.

Because the quantum dots 167 have sizes larger than the quantum dots 166, the respective quantum dot layers 191 to 195 have size different structures.

As described above, the active layer 265 includes a plurality of quantum dots 166, similar with the active layer 145. Therefore, the laser diode (not illustrated), including the active layer 265, is devised so as to be insensible to temperature, similar with the laser diode 130, including the active layer 145. Therefore, in case of the laser radar device (not-illustrated) including the active layer 265, the quality of vehicle control is also stable, without lowering, similar with the laser radar devices 100 including the active layer 145.

Further, the active layer 265 includes the multi-layered structure being formed by the quantum dot layers 191 to 195, similar with the active layer 145. Therefore, light emission intensity of the laser light L, in the laser diode including the active layer 265, is enhanced.

Because parts of the stripe-areas 191M to 195M (the window-areas 191Ma, 191Mb to 195Ma, 195Mb) are the low-density areas, absorptions of the laser light L are hard to occur, in the stripe-areas 191M to 195M. Further, the heat phenomena due to light absorption at the edge of the laser diode including the active layer 265 can be suppressed, thereby the lifetime of the laser diode including the active layer 265 can be improved.

Moreover, the low-density areas are formed in the window-areas 191Ma, 191Mb to 195Ma, 195Mb of the stripe-areas 191M to 195M. Therefore, when the laser light L, generated inside the stripe-areas 191M to 195M, is emitted from the laser light emission part 145A, absorption of the laser light L is also hard to occur.

Further, because the quantum dots 167, which are formed in the window-areas 191Ma, 191Mb to 195Ma, 195Mb, have sizes larger than the quantum dots 166, this makes band gap energy large. Therefore, absorptions of the laser light L, generated inside the active layer 265, are lowered in the window-areas 191Ma, 191Mb to 195Ma, 195Mb, thereby laser diode life time is extended.

On the other hand, the quantum dots 168 are respectively different in composition, as compared with the quantum dots 166. When the quantum dots 168 are formed in the window-areas 191Ma, 191Mb to 195Ma, 195Mb, the quantum dot layers 191 to 195 respectively have composition-different structures.

For example, when the quantum dots 166 are composed of $In_{0.5}Ga_{0.5}N$, the quantum dots 168 are able to be composed of $In_{0.4}Ga_{0.6}N$. In this case, operation and effect, similar with the case when the quantum dots 167 are formed in the window-areas 191Ma, 191Mb to 195Ma, 195Mb, are able to be obtained. As illustrated in FIG. 25, note that the quantum dots 168 are able to have the same size with the quantum dots 167, the quantum dots 168 are able to have the same size with the quantum dots 166.

Fourth Modified Example

Next, the laser diode and the laser radar device, according to the fourth modified example, will be explained with reference to FIG. 28. The laser diode and the laser radar device, according to the fourth modified example, are respectively different in the active layer of the laser diode, as compared with the above-described laser diode 130 and the laser radar device 100. Namely, in case of the above-described laser diode 130 and the laser radar device 100, the laser diode 130 includes the active layer 145. On the other hand, in case of the laser diode and the laser radar device, according to the fourth modified example, the laser diode includes an active layer 275, illustrated in FIG. 28.

The active layer 275 includes the five quantum dot layers 201, 202, 203, 204, 205. The active layer 275 has the multi-layered structure which the five quantum dot layers 201 to 205 are stacked, similar with the active layer 145.

Figure 28:
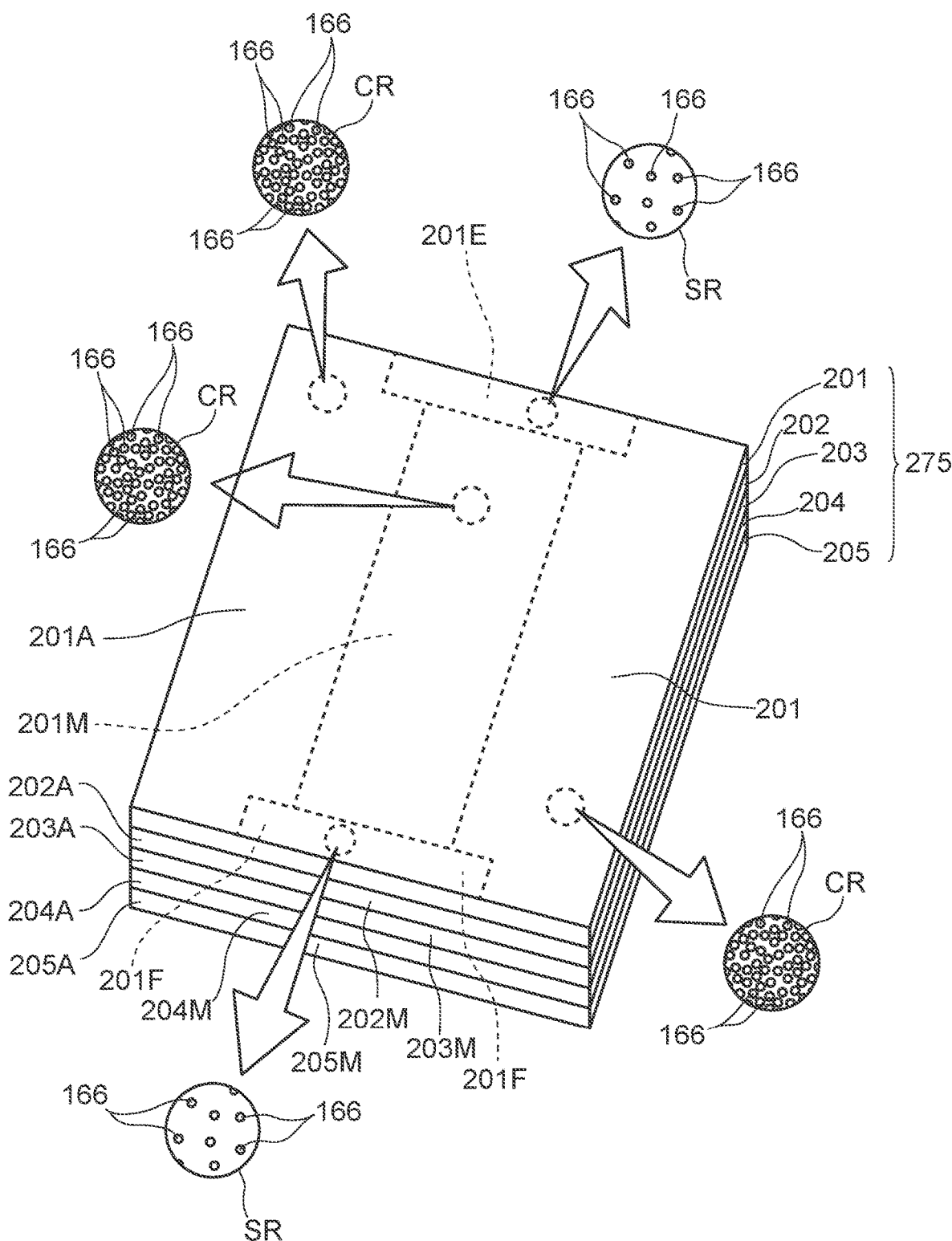
FIG. 28 is a perspective view showing the active layer, according to the fourth modified example, seen from the first layered quantum dot layer.

Further, as illustrated in FIG. 28, a plurality of quantum dots 166 are formed in the respective quantum dot layers 201 to 205, similar with the quantum dot layers 161 to 165.

Moreover, the quantum dot layers 201 to 205 respectively include stripe-areas 201M, 202M, 203M, 204M, 205M and side-areas 201A, 202A, 203A, 204A, 205A, similar with the quantum dot layers 161 to 165.

Then, window-areas 201E, 201F, 202E, 202F, 203E, 203F, 204E, 204F, 205E, 205F are formed in the respective stripe-areas 201M, 202M, 203M, 204M, 205M (illustrating is omitted about the window-areas 202E to 205E, 202F to 205F). Further, the window-areas 201E, 201F to 205E, 205F are the low-density areas.

In case of the window-areas 201E, 201F to 205E, 205F, as illustrated in FIG. 28, the lengths of the direction along by an end surface of the active layer 275 are extended than the stripe-areas 201M to 205M. Therefore, absorptions of the laser light L, in the window-areas 201E, 201F to 205E, 205F, are hard to occur, as compared with the active layer 145. Therefore, in case of the laser diode including the active layer 275, power consumption is reduced than the laser diode 130 including the active layer 145. Further, the heat phenomena due to light absorption at the edge of the laser diode including the active layer 275 can be suppressed, thereby the lifetime of the laser diode including the active layer 275 can be improved. Besides, in case of the laser diode including the active layer 275, operation and effect, similar with the laser diode including the active layer 145, are able to be obtained.

Fifth Modified Example

Next, the laser diode and the laser radar device, according to the fifth modified example, will be explained with reference to FIG. 29. The laser diode and the laser radar device, according to the fifth modified example, are respectively different in the active layer of the laser diode, as compared with the above-described laser diode 130 and the laser radar device 100. Namely, in case of the above-described laser diode 130 and the laser radar device 100, the laser diode 130 includes the active layer 145. On the other hand, in case of the laser diode and the laser radar device, according to the fifth modified example, the laser diode includes an active layer 285, illustrated in FIG. 29.

The active layer 285 includes the five quantum dot layers 211, 212, 213, 214, 215. The active layer 285 has the multi-layered structure which the five quantum dot layers 211 to 215 are stacked, similar with the active layer 145.

Figure 29:
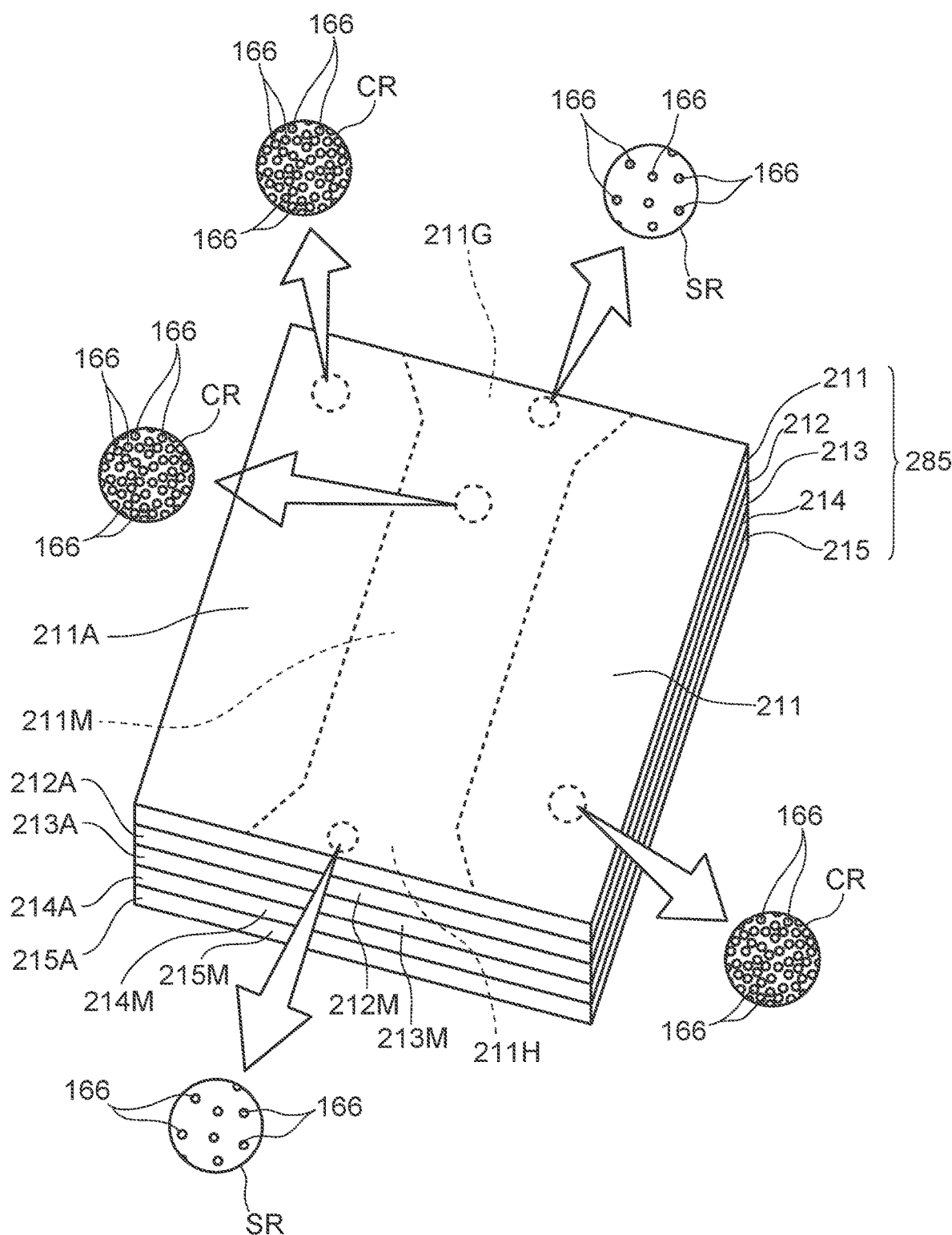
FIG. 29 is a perspective view showing the active layer, according to the fifth modified example, seen from the first layered quantum dot layer.
Figure 30:
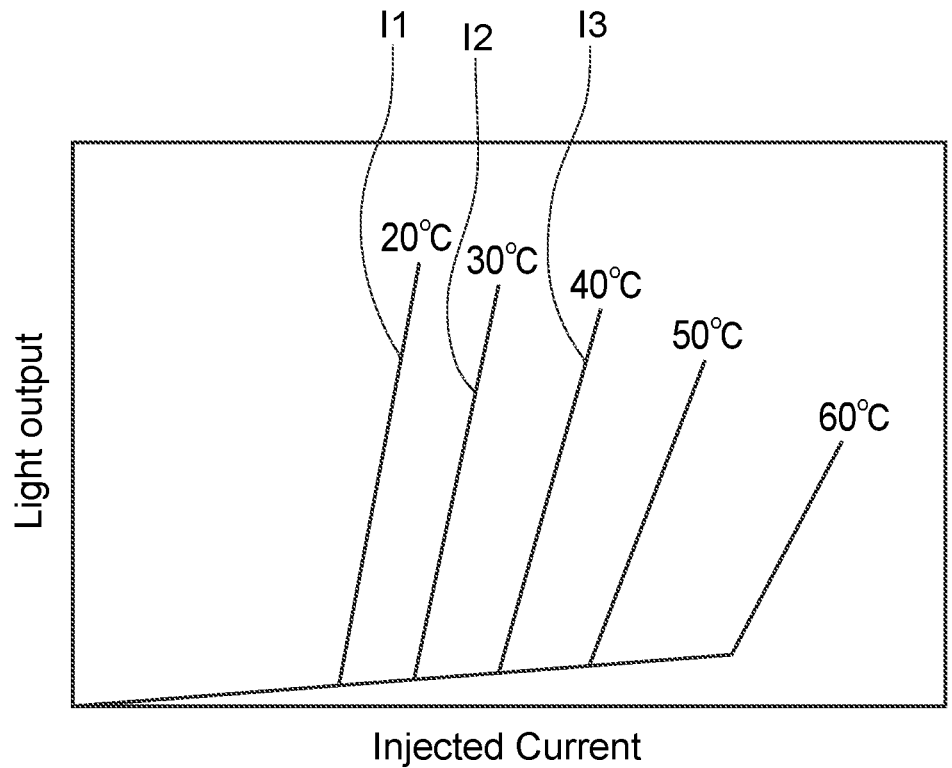
FIG. 30 is a graph showing intensity of optical output to a current of the laser diode.

Further, as illustrated in FIG. 29, a plurality of quantum dots 166 are formed in the respective quantum dot layers 211 to 215, similar with the quantum dot layers 161 to 165.

Moreover, the quantum dot layers 211 to 215 respectively include stripe-areas 211M, 212M, 213M, 214M, 215M and side-areas 211A, 212A, 213A, 214A, 215A, similar with the quantum dot layers 161 to 165.

Then, window-areas 211G, 211H, 212G, 212H, 213G, 213H, 214G, 214H, 215G, 215H are respectively formed in the stripe-areas 211M, 212M, 213M, 214M, 215M (illustrating is omitted about the window-areas 212G to 215G, 212H to 215H). Further, the window-areas 211G, 211H to 215G, 215H are the low-density areas.

In case of the window-areas 211G, 211H to 215G, 215H, as illustrated in FIG. 29, the lengths of the direction along by an end surface of the active layer 285 are extended than the stripe-areas 211M to 215M, as they gradually approach the end surface of the active layer 285. Therefore, absorptions of the laser light L, in the window-areas 211G, 211H to 215G, 215H, are hard to occur, as compared with the active layer 145. Therefore, in case of laser diode including the active layer 285, power consumption is reduced than the laser diode 130 including the active layer 145. Further, the heat phenomena due to light absorption at the edge of the laser diode including the active layer 285 can be suppressed, thereby the lifetime of the laser diode including the active layer 285 can be improved. Besides, in case of the laser diode including the active layer 285, operation and effect, similar with the laser diode including the active layer 145, are able to be obtained.

As described-above, the laser diode 130, of the light source-unit 360, is devised so as to be insensible to temperature, thereby the quality of vehicle control by the laser radar devices 100 is stable.

Note that the laser radar devices, mounted on the vehicle, are exemplarily explained though, the present invention is also applicable to the laser radar device mounted on an electronic device such as a mobile phone or the like. Further, the laser radar devices, including the MEMS scanner 7, are exemplarily explained though, the laser radar devices are able to include other scanners.

Further, in the above-mentioned embodiments, the case, which the five quantum dot layers are included, are exemplarily explained though as the active layer 145, it is preferable that the active layer includes at least two quantum dot layers.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A semiconductor laser comprising:
an active layer which emits laser light; and cladding layers being formed so as to sandwich the active layer,
wherein the active layer comprises a quantum dot layer including a plurality of quantum dots, which respectively confine movements of carriers in the three-dimensional directions;
wherein a stripe electrode being formed in a straight band-like shape, wherein the quantum dot layer comprises a low-density area of which arrangement density of the quantum dots is lower than the other areas, the low-density area is arranged in a stripe-area, corresponding to the stripe electrode.

2. The semiconductor laser according to claim 1, wherein the active layer comprises at least two quantum dot layers, wherein the active layer comprises a multi-layered structure which the at least two quantum dot layers are stacked.

3. The semiconductor laser according to claim 2, further comprising:
a stripe electrode being formed in a straight band-like shape,
wherein the multi-layered structure is a structure which window-formed quantum dot layers are stacked as the quantum dot layers, the window-formed quantum dot layer includes low-density areas of which arrangement density of the quantum dots are lower than the other areas, the low-density areas are arranged in window-areas, of stripe-areas corresponding to the stripe electrode, corresponding to a laser light emitting part which laser light is emitted.

4. The semiconductor laser according to claim 2,
wherein the multi-layered structure is a structure which even dot layers and uneven dot layers are stacked alternately, the even dot layers include the quantum dots, being formed in almost the whole of the respective quantum dot layers, and the uneven dot layers include non-dot areas, in which the quantum dots are not formed.

5. The semiconductor laser according to claim 4,
wherein the non-dot areas are arranged in window-areas corresponding to laser light emitting part which laser light is emitted, in the respective uneven dot layers.

6. The semiconductor laser according to claim 2,
wherein the multi-layered structure is a structure which even dot layers and uneven dot layers are stacked so that the even dot layers sandwich the uneven dot layers, the even dot layers include the quantum dots, being formed in almost the whole of the respective quantum dot layers, and the uneven dot layers include non-dot areas, in which the quantum dots are not formed.

7. The semiconductor laser according to claim 6,
wherein the non-dot areas are arranged in center-areas, including center parts of the uneven dot layers.

8. The semiconductor laser according to claim 1,
wherein the quantum dot layer comprises a low-density area of which arrangement density of the quantum dots is lower than the other areas.

9. The semiconductor laser according to claim 1, wherein the low-density area is arranged in a window-area, of the stripe-area, corresponding to a laser light emitting part which laser light is emitted.

10. The semiconductor laser according to claim 5,
wherein the quantum dot layer comprises size different structure which sizes of the quantum dots, formed in the low-density areas, are larger than sizes of the quantum dots, formed in the areas other than the low-density areas.

11. The semiconductor laser according to claim 5,
wherein the quantum dot layer comprises composition-different structures which compositions of the quantum dots, formed in the low-density areas, are different from compositions of the quantum dots, formed in the areas other than the low-density areas.

12. The semiconductor laser according to claim 5,
wherein the window-areas have lengths, of the direction along by an end surface of the active layer, being extended than the stripe-areas, in the respective quantum dot layers.

13. The semiconductor laser according to claim 5,
wherein the window-areas have lengths, of the direction along by an end surface of the active layer, being extended than the stripe-areas, as they gradually approach the end surface of the active layer, in the respective quantum dot layers.

14. A laser radar device comprising:

a light projection part which projects laser light; and a light receiving part which receives reflected light of the laser light, wherein the light projection part comprises a semiconductor laser and a scanner which reflects the laser light, emitted from the semiconductor laser, to form a scanning laser light, wherein the semiconductor laser comprises an active layer which emits laser light and cladding layers being formed so as to sandwich the active layer, wherein the active layer comprises a quantum dot layer including a plurality of quantum dots, which respectively confine movements of carriers in the three-dimensional directions;

wherein a stripe electrode being formed in a straight band-like shape, wherein the quantum dot layer comprises a low-density area of which arrangement density of the quantum dots is lower than the other areas, the low-density area is arranged in a stripe-area, corresponding to the stripe electrode.

15. The laser radar device according to claim 14, wherein the active layer comprises at least two quantum dot layers, wherein the active layer comprises a multi-layered structure which the at least two quantum dot layers are stacked.

16. The laser radar device according to claim 14, wherein the quantum dot layer comprises a low-density area of which arrangement density of the quantum dots is lower than the other areas.

* * * * *